(12) United States Patent
Yan et al.

(10) Patent No.: US 11,868,574 B2
(45) Date of Patent: Jan. 9, 2024

(54) TOUCH SUBSTRATE, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jun Yan, Beijing (CN); Lingran Wang, Beijing (CN); Erjin Zhao, Beijing (CN); Zhiliang Jiang, Beijing (CN); Gukhwan Song, Beijing (CN); Mingqiang Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/922,489

(22) PCT Filed: Aug. 5, 2021

(86) PCT No.: PCT/CN2021/110946
§ 371 (c)(1),
(2) Date: Oct. 31, 2022

(87) PCT Pub. No.: WO2022/057500
PCT Pub. Date: Mar. 24, 2022

(65) Prior Publication Data
US 2023/0176702 A1    Jun. 8, 2023

(30) Foreign Application Priority Data

Sep. 17, 2020 (WO) ................ PCT/CN2020/115956
Jun. 18, 2021 (CN) .......................... 202110681000.2

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *G06F 3/0445* (2019.05);
(Continued)

(58) Field of Classification Search
USPC ........................................................ 345/173
See application file for complete search history.

(56) References Cited

U.S. PATENT DOCUMENTS

2007/0046193 A1    3/2007  Rhee et al.
2014/0346027 A1*  11/2014  Li .......................... G06F 3/0443
                                                            200/600
(Continued)

FOREIGN PATENT DOCUMENTS

CN    108873512 A    11/2018
CN    108874233 A    11/2018
(Continued)

OTHER PUBLICATIONS

Ex Parte Quayle Office Action for corresponding U.S. Appl. No. 17/310,375, dated Apr. 14, 2023, 9 pages.
(Continued)

*Primary Examiner* — Chineyere D Wills-Burns
(74) *Attorney, Agent, or Firm* — Dority & Manning, P.A.

(57) ABSTRACT

A touch substrate is provided with a mounting hole, and has a hole edge region around the mounting hole, and a main touch region located outside of the hole edge region. The touch substrate includes a substrate a plurality of first touch units disposed on the substrate and a plurality of second touch units disposed on the substrate and insulated from the plurality of first touch units. Each first touch unit extends in (Continued)

a first direction and includes a plurality of first touch electrodes and a plurality of first connecting portions, and each first connecting portion is electrically connected to two adjacent first touch electrodes. Each second touch unit extends in a second direction and includes a plurality of second touch electrodes and a plurality of second connecting portions. Each second connecting portion being electrically connected to two adjacent second touch electrodes; and the first direction intersecting with the second direction.

20 Claims, 22 Drawing Sheets

(51) Int. Cl.
    *G09F 9/30*     (2006.01)
    *H10K 59/00*     (2023.01)
    *H10K 50/86*     (2023.01)
    *H10K 59/40*     (2023.01)

(52) U.S. Cl.
    CPC .............. *G06F 3/0448* (2019.05); *G09F 9/30* (2013.01); *H10K 59/00* (2023.02)

(56) References Cited

U.S. PATENT DOCUMENTS

| | | | | |
|---|---|---|---|---|
| 2016/0162084 A1* | 6/2016 | Wang | .................... | G06F 3/0446 345/173 |
| 2017/0255287 A1 | 9/2017 | Huang et al. | | |
| 2018/0039358 A1 | 2/2018 | Xie et al. | | |
| 2018/0366495 A1* | 12/2018 | Xu | .................... | H01L 27/124 |
| 2019/0079622 A1* | 3/2019 | Choi | .................... | G06F 3/0443 |
| 2020/0167041 A1* | 5/2020 | Jeong | .................... | G06F 3/0443 |
| 2020/0225784 A1 | 7/2020 | Hwangbo et al. | | |
| 2021/0303104 A1* | 9/2021 | Yang | .................... | G06F 3/0448 |
| 2021/0367000 A1* | 11/2021 | Kim | .................... | G06F 3/0412 |
| 2021/0397320 A1* | 12/2021 | Ye | .................... | G06F 3/0448 |
| 2022/0229516 A1* | 7/2022 | Kim | .................... | H10K 50/844 |
| 2022/0253177 A1 | 8/2022 | Fan et al. | | |
| 2022/0350446 A1* | 11/2022 | Song | .................... | G06F 3/04164 |

FOREIGN PATENT DOCUMENTS

| | | |
|---|---|---|
| CN | 208110574 U | 11/2018 |
| CN | 109164945 A | 1/2019 |
| CN | 109375437 A | 2/2019 |
| CN | 109545085 A | 3/2019 |
| CN | 110007804 A | 7/2019 |
| CN | 110489012 A | 11/2019 |
| WO | WO2019052125 A1 | 3/2019 |

OTHER PUBLICATIONS

PCT International Search Report and Written Opinion (w/ English translation) for corresponding PCT Application No. PCT/CN2021/110946, dated Nov. 4, 2021, 13 pages.

PCT International Search Report and Written Opinion (w/ English translation) for corresponding PCT Application No. PCT/CN2020/115956, dated Jun. 22, 2021, 18 pages.

Notice of Allowance for corresponding U.S. Appl. No. 17/310,375, dated Jul. 26, 2023, 13 pages.

* cited by examiner

US 11,868,574 B2

TOUCH SUBSTRATE, DISPLAY PANEL AND DISPLAY DEVICE

CROSS-REFERENCE TO RELATED APPLICATIONS

This application is a national phase entry under 35 USC 371 of International Patent Application No. PCT/CN2021/110946 filed on Aug. 5, 2021, which claims priority to PCT International Application No. PCT/CN2020/115956, filed on Sep. 17, 2020, and priority to Chinese Patent Application No. 202110681000.2, filed on Jun. 18, 2021, which are incorporated herein by reference in their entirety.

TECHNICAL FIELD

The present disclosure relates to the field of display technologies, and in particular, to a touch substrate, a display panel and a display device.

BACKGROUND

With rapid development of active matrix organic light-emitting diode (AMOLED) technology, AMOLED display devices have gradually attracted people's attention. In the future, the AMOLED display devices will develop towards a direction of full screen, narrow bezel, high resolution, curling wear and being foldable.

SUMMARY

In an aspect, a touch substrate is provided. The touch substrate is provided with a mounting hole, and the touch substrate has a hole edge region around the mounting hole, and a main touch region located outside of the hole edge region. The touch substrate includes a substrate, a plurality of first touch units and a plurality of second touch units that are disposed on the substrate. Each first touch unit extends in a first direction, each first touch unit includes a plurality of first touch electrodes and a plurality of first connecting portions, and each first connecting portion is electrically connected to two adjacent first touch electrodes. The plurality of second touch units are insulated from the plurality of first touch units, Each second touch unit extends in the second direction, the second touch unit includes a plurality of second touch electrodes and a plurality of second connecting portions, and each second connecting portion is electrically connected to two adjacent second touch electrodes. The first direction intersects with the second direction.

An orthogonal projection of each first connecting portion on the substrate at least partially overlaps with an orthogonal projection of a second connecting portion on the substrate, and the first connecting portion and the corresponding second connecting portion form a connecting unit. A plurality of connecting units located in the hole edge region are hole edge connecting units, and at least one of the plurality of hole edge connecting units is an adjustment connecting unit.

In a first touch unit corresponding to the adjustment connecting unit, a straight line where a line connecting centers of at least two first touch electrodes located in the main touch region is located is a first reference line. In a second touch unit corresponding to the adjustment connecting unit, a straight line where a line connecting centers of at least two second touch electrodes located in the main touch region is located is a second reference line. An intersection point of the first reference line and the second reference line is a hole edge reference point. In a direction parallel to a plane of the substrate on which the plurality of first touch units and the plurality of second touch units are disposed, at least a part of the adjustment connecting unit is further from an edge of the mounting hole than the hole edge reference point.

In some embodiments, the hole edge connecting units include a first hole edge connecting unit, a second hole edge connecting unit, a third hole edge connecting unit and a fourth hole edge connecting unit that are disposed around the mounting hole. In the first direction, the first hole edge connecting unit and the third hole edge connecting unit are adjacent to each other and are electrically connected to a same first touch electrode, and the second hole edge connecting unit and the fourth hole edge connecting unit are adjacent to each other and are electrically connected to another same first touch electrode. In the second direction, the first hole edge connecting unit and the second hole edge connecting unit are adjacent to each other and are electrically connected to a same second touch electrode, and the third hole edge connecting unit and the four hole edge connecting unit are adjacent to each other and are electrically connected to another same second touch electrode.

In some embodiments, a hole edge reference point corresponding to the first hole edge connecting unit is a first hole edge reference point, and a hole edge reference point corresponding to the second hole edge connecting unit is a second hole edge reference point, a hole edge reference point corresponding to the third hole edge connecting unit is a third hole edge reference point, and a hole edge reference point corresponding to the fourth hole edge connecting unit is a fourth hole edge reference point.

In the direction parallel to the plane of the substrate, of the first hole edge connecting unit, the second hole edge connecting unit, the third hole edge connecting unit and the fourth hole edge connecting unit, at least one hole edge connecting unit is the adjustment connecting unit, and a distance between a center of the adjustment connecting unit and a center of the mounting hole is greater than a distance between a hole edge reference point corresponding to the adjustment connecting unit and the center of the mounting hole. In a case where of the first hole edge connecting unit, the second hole edge connecting unit, the third hole edge connecting unit and the fourth hole edge connecting unit, the at least one hole edge connecting unit includes one adjustment connecting unit, two adjustment connecting units or three adjustment connecting units, of the first hole edge connecting unit, the second hole edge connecting unit, the third hole edge connecting unit and the fourth hole edge connecting unit, a center of each hole edge connecting unit of three edge connecting units, two edge connecting units or one hole edge connecting unit other than the one adjustment connecting unit, the two adjustment connecting units or the three adjustment connecting units overlaps with a corresponding hole edge reference point.

In some embodiments, in the direction parallel to the plane of the substrate, of the first hole edge connecting unit, the second hole edge connecting unit, the third hole edge connecting unit and the fourth hole edge connecting unit, distances between centers of at least two hole edge connecting units and the center of the mounting hole are different.

In some embodiments, the first hole edge connecting unit and the third hole edge connecting unit are adjustment connecting units, and a center of the first hole edge connecting unit and a center of the third hole edge connecting unit are symmetrical with respect to a straight line passing through a center of the mounting hole in the second direction; and/or the second hole edge connecting unit and the fourth hole edge connecting unit are adjustment connecting units, and a center of the second hole edge connecting unit and a center of the fourth hole edge connecting unit are symmetrical with respect to the straight line passing through the center of the mounting hole in the second direction.

In some embodiments, in the direction parallel to the plane of the substrate, a center of the adjustment connecting unit is on the first reference line or the second first reference line.

In some embodiments, in the direction parallel to the plane of the substrate, a distance between a center of the adjustment connecting unit and a center of the mounting hole is in a range of 2.5 mm to 3.5 mm, inclusive.

In some embodiments, in each first touch electrode includes two first sub-electrodes electrically connected to each other, and each second touch electrode includes two second sub-electrodes electrically connected to each other. The plurality of first touch units and the plurality of second touch units are divided into a plurality of capacitor units, and each capacitor unit includes a single connecting unit, and two adjacent first sub-electrodes that are electrically connected to the connecting unit and two adjacent second sub-electrodes that are electrically connected to the connecting unit.

A difference between mutual capacitance values of a capacitor unit, before touch occurs in a region of the capacitor unit and after touch occurs in the region thereof, where the adjustment connecting unit is located is C1, and a difference between mutual capacitance values of a capacitive unit, before touch occurs in a region of the capacitor unit and after touch occurs in the region thereof, located in the main touch region is C2; and a ratio of C1 to C2 is in a range of 0.55 to 0.58, inclusive.

In some embodiments, the at least one of the plurality of hole edge connecting units includes a plurality of adjustment connecting units, shapes of two adjacent first sub-electrodes electrically connected to a same adjustment connecting unit are different from a shape of a first sub-electrode located in the main touch region. Shapes of two adjacent second sub-electrodes electrically connected to another same adjustment connecting unit are different from a shape of a second sub-electrode located in the main touch region.

In some embodiments, the at least one of the plurality of hole edge connecting units includes the plurality of adjustment connecting units, of two adjacent first sub-electrodes and two adjacent second sub-electrodes that are electrically connected to a same adjustment connecting unit, shapes of contours, proximate to each other, of a first sub-electrode and a second sub-electrode are complementary to each other.

In some embodiments, the at least one of the plurality of hole edge connecting units includes a plurality of adjustment connecting units, two adjacent first touch electrodes electrically connected to a same adjustment connecting unit are respectively a first electrode and a second electrode, and the second electrode is farther from the mounting hole than the first electrode. Two adjacent second touch electrodes electrically connected to another same adjustment connecting unit are respectively a third electrode and a fourth electrode, and the fourth electrode is farther from the mounting hole than the third electrode.

A ratio of an area of a region defined by an outer contour of the first electrode to an area of a region defined by an outer contour of a first touch electrode located in the main touch region is greater than or equal to 0.5; a ratio of an area of a region defined by an outer contour of the second electrode to the area of the region defined by the outer contour of the first touch electrode located in the main touch region is greater than or equal to 0.5; a ratio of an area of a region defined by an outer contour of the third electrode to an area of a region defined by an outer contour of a second touch electrode located in the main touch region is greater than or equal to 0.5; and a ratio of an area of a region defined by an outer contour of the fourth electrode to the area of the region defined by the outer contour of the second touch electrode located in the main touch region is greater than or equal to 0.5.

In some embodiments, a ratio of the area of the first electrode to the area of the second electrode is in a range of 0.8 to 1.2, inclusive; and/or, a ratio of the area of the third electrode to the area of the fourth electrode is in a range of 0.8 to 1.2, inclusive.

In some embodiments, a ratio of a sum of the area of the first electrode and the area of the second electrode to a sum of the area of the third electrode and the area of the fourth electrode is in a range of 0.8 to 1.2, inclusive.

In some embodiments, the contours of the first electrode, the second electrode, the third electrode and the fourth electrode each have protrusions in various shapes, and the protrusions in various shapes include at least two of a wavy protrusion, a rectangular protrusion, a trapezoidal protrusion and a triangular protrusion; and/or, the contours of the first electrode, the second electrode, the third electrode and the fourth electrode are each formed by a broken line.

In some embodiments, the touch substrate includes an insulating layer disposed on the substrate. The insulating layer is provided with a plurality of via holes therein.

A layer where plurality of first touch electrodes, the plurality of second touch electrodes and the plurality of first connecting portions are disposed is an electrode layer, and a layer where the plurality of second connecting portions are disposed is an bridge layer; the electrode layer is closer to or farther from the substrate than the bridge layer, the insulating layer is located between the electrode layer and the bridge layer; in the first direction, every two adjacent first touch electrodes are directly electrically connected through a first connecting portion therebetween; in the second direction, the second connecting portion is electrically connected to the two adjacent second touch electrodes through different via holes.

A layer where plurality of first touch electrodes, the plurality of second touch electrodes and the plurality of second connecting portions are disposed is the electrode layer, and a layer where the plurality of first connecting portions are disposed is the bridge layer; the electrode layer is closer to or farther from the substrate than the bridge layer, the insulating layer is located between the electrode layer and the bridge layer; in the second direction, every two adjacent second touch electrodes are electrically connected through a second connecting portion therebetween; in the first direction, the first connecting portion is electrically connected to the two adjacent first touch electrodes through different via holes.

In some embodiments, the plurality of first connecting portions are disposed in the bridge layer, the first connecting portion includes at least one first bridge electrode, and the at least one first bridge electrode is electrically connected to the two adjacent first touch electrodes; or, the plurality of second connecting portions are disposed in the bridge layer, and the second connecting portion includes at least one second bridge electrode, and the at least one second bridge electrode is electrically connected to the two adjacent second touch electrodes.

In some embodiments, the plurality of first connecting portions are disposed in the bridge layer, the first connecting portion includes a plurality of first bridge electrodes arranged side by side in the second direction, and each first bridge electrode is electrically connected to the two adjacent first touch electrodes, and extends in the first direction; or, the plurality of second connecting portions are disposed in the bridge layer, and the second connecting portion includes a plurality of second bridge electrodes arranged side by side in the first direction, and each second bridge electrode is electrically connected to the two adjacent second touch electrodes, and extends in the second direction.

In some embodiments, the first connecting portion, the second connecting portion, each first touch electrode and each second touch electrode each have a metal mesh structure.

In some embodiments, a line width of a metal mesh of a touch electrode located in the hole edge region is greater than a line width of a metal mesh of a touch electrode located in the main touch region.

In some embodiments, the line width of the metal mesh of the touch electrode located in the hole edge region is in a range of 4 μm to 4.8 μm, inclusive; and the line width of the metal mesh of the touch electrode located in the main touch region is in a range of 3.8 μm to 4.2 μm, inclusive.

In some embodiments, the main touch region includes a corner region, and at least one connecting unit located in the corner region is a corner connecting unit.

In a first touch unit corresponding to the corner connecting unit, a straight line where a line connecting centers of at least two first touch electrodes located in the main touch region is located is a third reference line; in a second touch unit corresponding to the corner connecting unit, a straight line where a line connecting centers of at least two second touch electrodes in the main touch region is located is a fourth reference line; and an intersection point of the third reference line and the fourth reference line is a corner reference point. In the direction parallel to the plane of the substrate, the corner reference point is farther from a center of the mounting hole than a center of the corner connecting unit.

In some embodiments, in a first touch unit and a second touch unit passing through the mounting hole, each touch electrode around the mounting hole is a hole edge electrode. The touch substrate further includes a connecting ring disposed around the mounting hole, the connecting ring including at least two connecting segments arranged at intervals, and each connecting segment being electrically connected to a hole edge electrode.

In some embodiments, the touch substrate includes a first hole edge electrode and a second hole edge electrode, the connecting ring includes a first connecting segment and a second connecting segment; the first connecting segment is electrically connected to the first hole edge electrode, and the second connecting segment is electrically connected to the second hole edge electrode. An area of the first hole edge electrode is less than an area of the second hole edge electrode, and a length of the first connecting segment is greater than a length of the second connecting segment.

In some embodiments, the touch substrate further has a wiring region around the mounting hole, and the wiring region is located between the mounting hole and the hole edge region; and the touch substrate further includes a light blocking ring disposed in the wiring region, the light blocking ring having at least one opening therein, and the light blocking ring being unconnected at the at least one opening.

In some embodiments, the light blocking ring at least includes a first light blocking layer and a second light blocking layer that are stacked on the substrate in sequence. The first light blocking layer is made of a same material and disposed in a same layer as the first touch electrodes and the second touch electrodes. The second light blocking layer is made of a same material and disposed in another same layer as the connecting ring.

In some embodiments, a dimension of the touch substrate in the first direction is greater than a dimension of the touch substrate in the second direction, a first touch electrode is provided therein with an opening; or, a dimension of the touch substrate in the second direction is greater than a dimension of the touch substrate in the first direction, a second touch electrode is provided therein with another opening.

In some embodiments, a shape of a dummy electrode located in the hole edge region is different from a shape of a dummy electrode located in the main touch region.

In another aspect, a display panel is provided. The display panel includes a display substrate, and the touch substrate in any one of the above embodiments. The touch substrate is disposed on a light exit side of the display substrate.

In some embodiments, the display substrate is provided with a functional device mounting hole therein, and the functional device mounting hole corresponds to the mounting hole of the touch substrate.

The display substrate includes at least one circle of barrier wall around the functional device mounting hole, and an encapsulation layer covering the at least one circle of barrier wall; and the encapsulation layer includes a planarization region and a slope region proximate to the functional device mounting hole. Orthogonal projections of the hole edge connecting units in the touch substrate on the display substrate are within the planarization region of the encapsulation layer.

In some embodiments, a minimum distance between a center of an orthogonal projection of the adjustment connecting unit on the display substrate and the at least one circle of barrier wall is in a range of 0.8 mm to 1.2 mm, inclusive.

In some embodiments, the display substrate and the touch substrate share the substrate, and the plurality of first touch units and the plurality of second touch units of the touch substrate are directly disposed on the encapsulation layer of the display substrate.

In yet another aspect, a display device is provided. The display device includes the display panel in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure are related.

DETAILED DESCRIPTION

Figure 1:
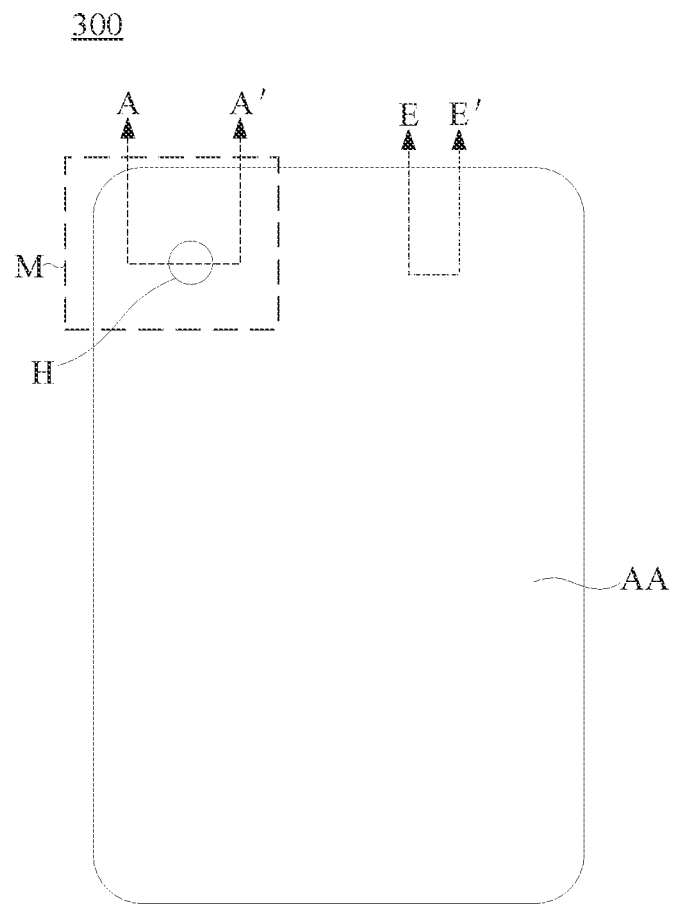
FIG. 1 is a structural diagram of a display panel, in accordance with some embodiments of the present disclosure.

Technical solutions in some embodiments of the present disclosure will be described dearly and completely below with reference to accompanying drawings. Obviously, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with the term such as "first" or "second" may explicitly or implicitly include one or more features. In the description of the embodiments of the present disclosure, the term "a plurality of/the plurality of" means two or more unless otherwise specified.

In the description of some embodiments, the term "electrically connected" and extensions thereof may be used. For example, the term "connected" may be used in the description of some embodiments to indicate that two or more components are in direct physical or electrical contact with each other.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The term such as "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

The "same layer" refers to a layer structure that is formed by performing, using a mask, a patterning process on a film layer for forming specific patterns which was formed by a film forming process. Depending on different specific patterns, the patterning process may include several exposure, development or etching processes, the specific patterns in the formed layer structure may be continuous or discontinuous, and these specific patterns may also be at different heights or have different thicknesses.

Exemplary embodiments are described herein with reference to sectional views and/or plan views as idealized exemplary drawings. In the accompanying drawings, thickness of layers and areas of regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but as including shape deviations due to, for example, manufacturing. For example, an etched region that is shown in a rectangle generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display panel. As shown in FIG. 1, the display panel 300 includes an active touch display region AA and a hole H located in the active touch display region AA.

It will be noted that the hole H is provided in the display region AA of the display panel 300 through a manner of mechanical punching or laser drilling, and the hole H is used to mount functional devices, such as a camera. A technology of forming the hole in the display region AA of the display panel 300 to place the camera is referred to as an active area hole (AA Hole) technology.

Figure 2A:
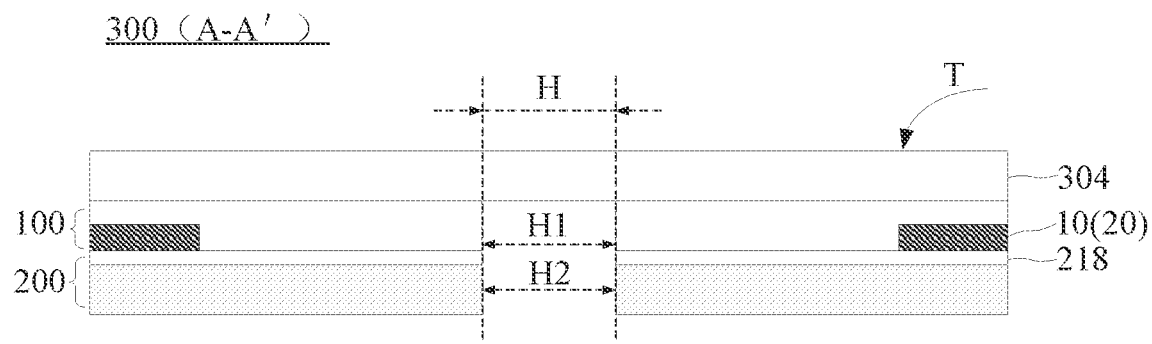
FIG. 2A is a sectional view of the display panel in FIG. 1 taken along the line A-A'.

As shown in FIG. 2A, the display panel 300 includes a display substrate 200 and a touch substrate 100 disposed on a light exit side T of the display substrate 200.

The hole H includes a mounting hole H1 provided in the touch substrate 100 and a functional device mounting hole H2 provided in the display substrate 200. The functional device mounting hole H2 and the mounting hole H1 of the touch substrate 100 correspond and communicate with each other.

Figure 21:
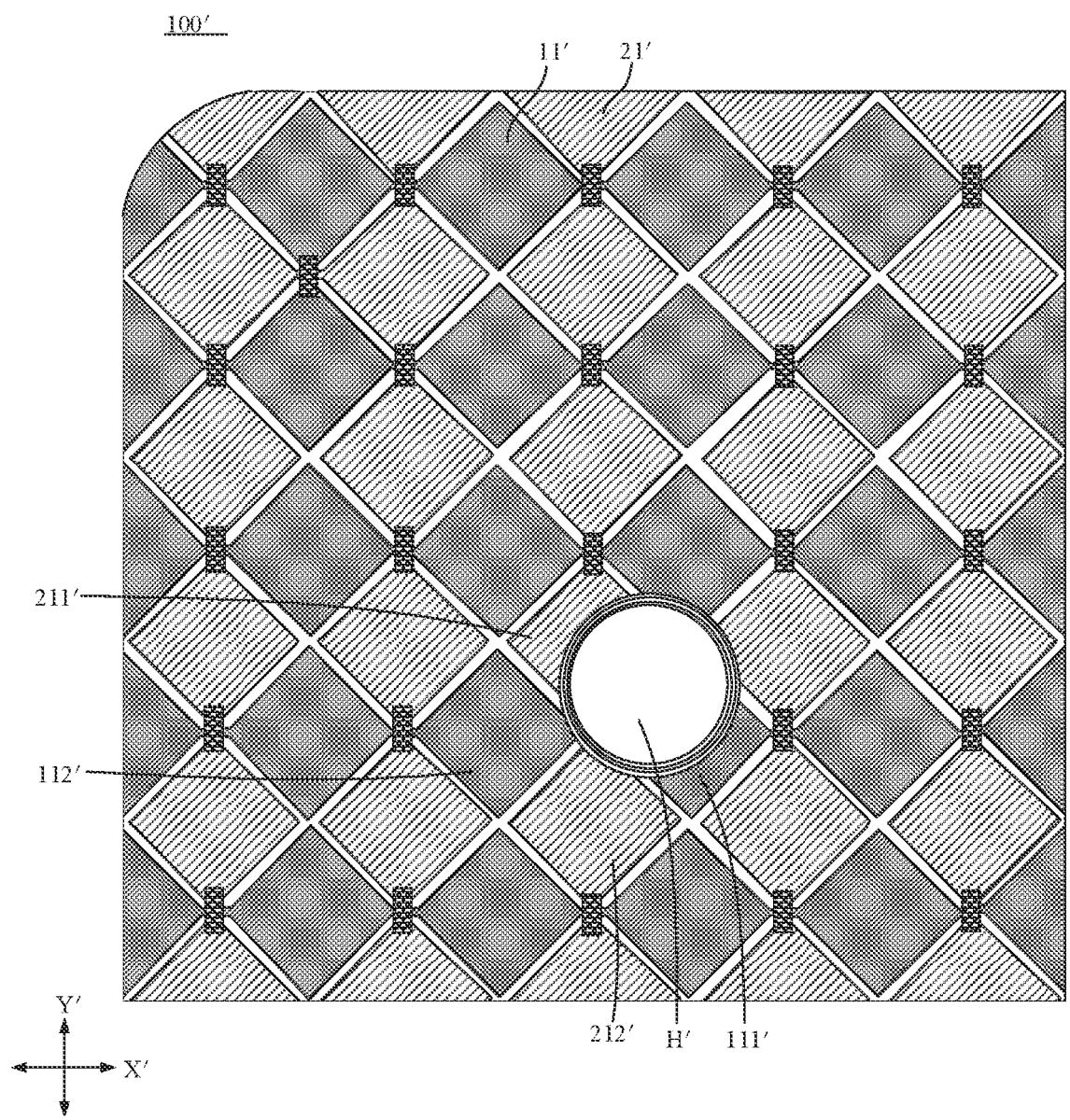
FIG. 21 is a structural diagram of a touch substrate in the related art.

In the related art, as shown in FIG. 21, a touch substrate 100' includes a plurality of first touch electrodes 11' and a plurality of second touch electrodes 12'. A mutual capacitance may be generated between a first touch electrode 11' and a second touch electrode 12'. Mutual capacitance values of these touch electrodes after being touched will change, so that a touch position may be determined by detecting amounts of changes in the mutual capacitance values.

The inventors of the present disclosure found that the hole provided inside a display panel will destroy integrity of touch electrodes at a position of the touch substrate 100' where the hole is provided, so that a contour circumference of a touch electrode located around a mounting hole H' is less than a contour circumference of a touch electrode located in a normal region. As a result, a facing area of touch electrodes located around the mounting hole H' is less than a facing area of touch electrodes located in the normal region. Therefore, there is a large difference between mutual capacitance values generated after the touch electrodes located around the mounting hole H' and the touch electrodes located in the normal region are touched. When a finger scribes a line on the touch substrate 100' and passes through a periphery of the mounting hole H', since the mutual capacitance values of the touch electrodes around the mounting hole H' are small, the scribed line may vibrate, for example, may curve and even break, on the periphery of the mounting hole H'. As a result, linearity of the scribed line on the touch substrate 100' is poor.

In addition, in order to provide the hole inside the display panel, a connecting portion between the touch electrodes may also be removed. In order to realize electrical connection between the touch electrodes, in the related art, two adjacent first touch electrodes 11' that are disconnected are electrically connected by a first bridge, and two adjacent second touch electrodes 12' that are disconnected are electrically connected by a second bridge. The first bridge and the second bridge are disposed around the mounting hole H'. However, this connecting manner will result in poor anti-static capability of the two touch electrodes that are electrically connected by the bridge.

Figure 3A:
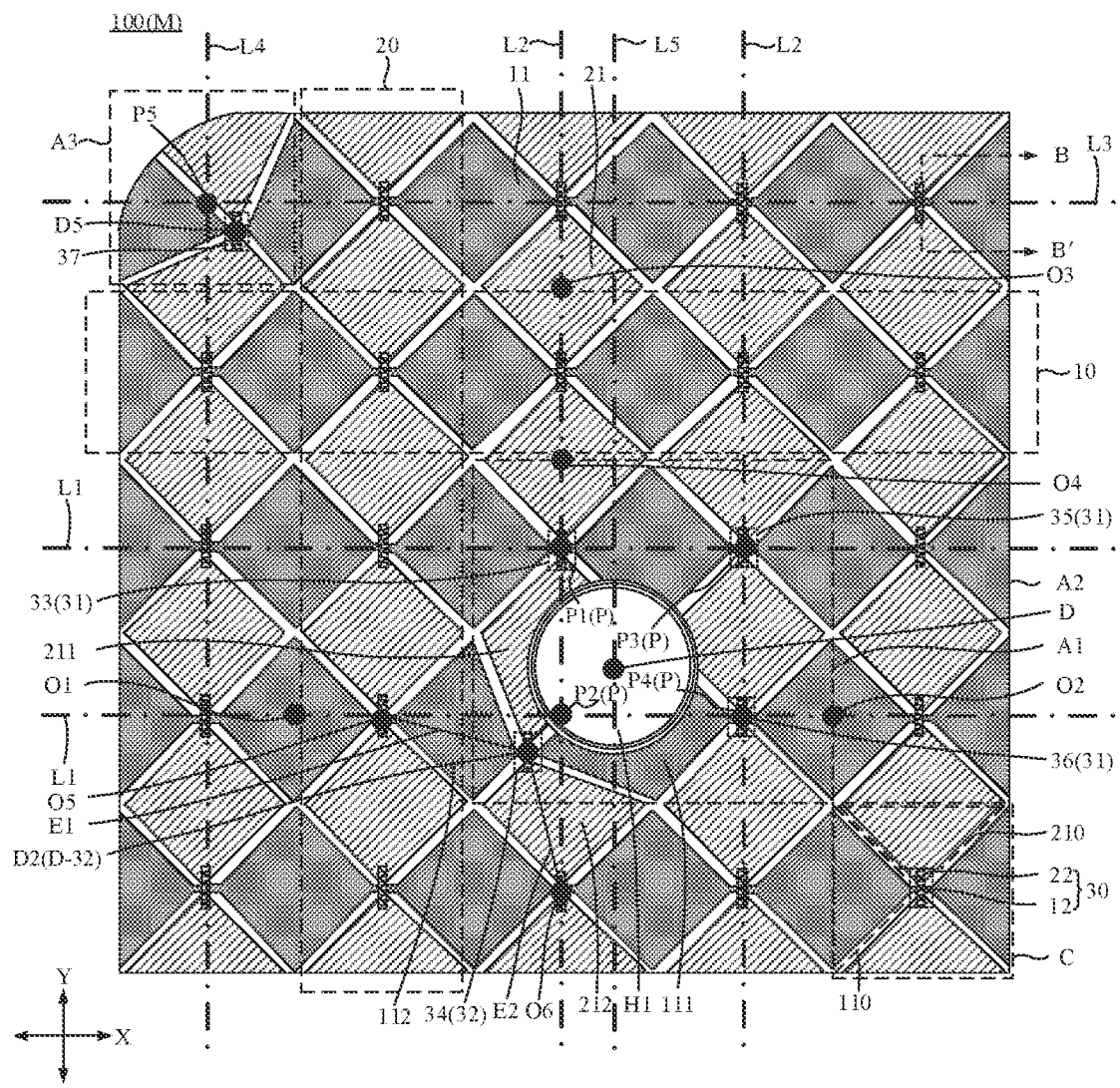
FIG. 3A is a top view of the M region of a touch substrate in FIG. 1.

In order to solve the above problems, some embodiments of the present disclosure provide a touch substrate. As shown in FIG. 3A, the touch substrate 100 is provided with the mounting hole H1, and the touch substrate 100 has a hole edge region A1 around the mounting hole H1 and a main touch region A2 located outside of the hole edge region A1.

For example, a diameter of the mounting hole H1 is in a range of 3 mm to 5 mm, inclusive. For example, the diameter is 3 mm, 3.5 mm, 4 mm, 4.5 mm or 5 mm.

Figure 4:
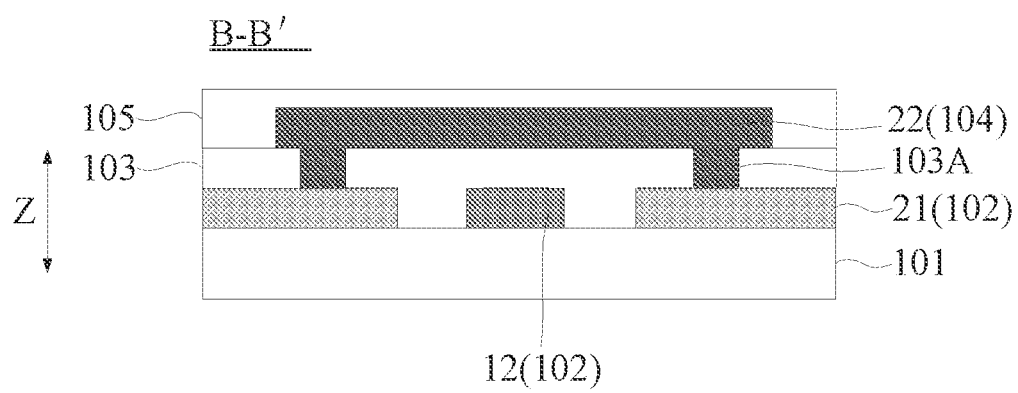
FIG. 4 is a sectional view of the touch substrate in FIG. 3A taken along the line B-B'.

As shown in FIGS. 3A and 4, the touch substrate 100 includes a substrate 101, a plurality of first touch units 10 and a plurality of second touch units 20. The first touch unit 10 extends along a first direction X, and the second touch unit 20 extends along a second direction Y. The first touch unit 10 and the second touch unit 20 are insulated from each other, and the first direction X intersects with the second direction Y. For example, the first direction X is perpendicular to the second direction Y.

It will be noted that, as shown in FIG. 2A, the plurality of first touch units 10 and the plurality of second touch units 20 in the touch substrate 100 may be directly disposed on an encapsulation layer 218 of the display substrate 200 through flexible multi-layer on cell (FMLOC) technology. In this case, the "substrate 101" of the touch substrate 100 is the encapsulation layer 218 of the display substrate 200.

In addition, in a case where the touch substrate 100 is attached to the display substrate 200 in an out-cell manner, the touch substrate 100 includes the substrate 101, and the plurality of first touch units 10 and the plurality of second touch units 20 are disposed on the substrate 101.

As shown in FIG. 3A, the first touch unit 10 includes a plurality of first touch electrodes 11 and a plurality of first connecting portions 12, and each first connecting portion 12 is electrically connected to two adjacent first touch electrodes 11. The second touch unit 20 includes a plurality of second touch electrodes 21 and a plurality of second connecting portions 22, and each second connecting portion 22 is electrically connected to two adjacent second touch electrodes 21.

It will be noted that an area of the mounting hole H1 is 5, and satisfies the following formula:

$$2S1 \leq S \leq 4S1$$

where "S1" refers to an average value of a sum of an area of the first touch electrode 11 and an area of the second touch electrode 21 that are located in the main touch region A2.

As shown in FIGS. 3A and 4, an orthogonal projection of each first connecting portion 12 on the substrate 101 at least partially overlap with an orthogonal projection of a second connecting portion 22 on the substrate 101, and the first connecting portion 12 and the corresponding connecting portion 22 form a connecting unit 30.

It will be noted that, as shown in FIG. 3A, the first touch electrode 11 includes two first sub-electrodes 110 that are electrically connected to each other (the two first sub-electrodes 110 are formed as a whole), and the second touch electrode 21 includes two second sub-electrodes 210 that are electrically connected to each other (the two second sub-electrodes 210 are formed as a whole). The plurality of first touch units 10 and the plurality of second touch units 20 are divided into a plurality of capacitor units C, and each capacitor unit C includes a connecting unit 30 and two adjacent first sub-electrodes 110 that are electrically connected to the connecting unit 30 and two adjacent second sub-electrodes 210 that are electrically connected to the connecting unit 30.

In addition, the "hole edge region A1" refers to a region defined by four capacitor units C that surround the mounting hole H1 and are adjacent to the mounting hole H1.

As shown in FIG. 3A, of all connecting units 30, a plurality of connecting units 30 located in the hole edge region A1 are a plurality of hole edge connecting units 31, and at least one of the plurality of hole edge connecting units 31 is an adjustment connecting unit 32. In a first touch unit 10 corresponding to the adjustment connecting unit 32, a straight line where a line connecting centers O1, O2 of at least two first touch electrodes 11 located in the main touch region A2 is located is a first reference line L1. In a second touch unit 20 corresponding to the adjustment connecting unit 32, a straight line where a line connecting centers O3, O4 of at least two second touch electrodes 21 located in the main touch region A2 is located is a second reference line L2. An intersection point of the first reference line L1 and the second reference line L2 is a hole edge reference point P. In the direction parallel to a plane of the substrate 101, at least a part of the adjustment connecting unit 32 is farther from the edge of the mounting hole H1 than the hole edge reference point P.

It will be understood that, as shown in FIG. 3A, in the direction parallel to the plane of the substrate 101, a minimum distance between the at least a part of the adjustment connecting unit 32 and the edge of the mounting hole H1 is greater than a minimum distance between the hole edge reference point P and the edge of the mounting hole H1.

For example, as shown in FIG. 3A, in the direction parallel to the plane of the substrate 101, any part of the adjustment connecting unit 32 is farther from the edge of the mounting hole H1 than the hole edge reference point P. That is, in the direction parallel to the plane of the substrate 101, a minimum distance between any part of the adjustment connecting unit 32 and the edge of the mounting hole H1 is greater than the minimum distance between the hole edge reference point P and the edge of the mounting hole H1.

For example, as shown in FIG. 3A, in the direction parallel to the plane of the substrate 101, a center D-32 of the adjustment connecting unit 32 is farther from the edge of the mounting hole H1 than the hole edge reference point P. That is, in the direction parallel to the plane of the substrate 101, the minimum distance between the center D-32 of the adjustment connecting unit 32 and the edge of the mounting hole H1 is greater than the minimum distance between the hole edge reference point P and the edge of the mounting hole H1.

Moreover, in conjunction with FIGS. 3A and 4, in a thickness direction Z of the substrate 101, of the plurality of hole edge connecting units 31, centers of other hole edge connecting units 31 other than the adjustment connecting unit 32 each overlap with a corresponding hole edge reference point P. The center of the "adjustment connecting unit 32" does not overlap with the corresponding hole edge reference point P. In conjunction with FIGS. 3A and 21, it may be understood as adjusting the position of the hole edge connecting unit 31, so that the hole edge connecting unit 31 is farther from the mounting hole H1 than the corresponding hole edge reference point P. The hole edge connecting unit 31 whose position is adjusted is the "adjustment connecting unit 32". The "center of the connecting unit" refers to a center of an orthogonal projection of the connecting unit on the substrate 101.

It will be noted that, since the position of the adjustment connecting unit 32 is adjusted relative to the position of the corresponding hole edge reference point P, shapes of contours of touch electrodes electrically connected to the adjustment connecting unit 32 are changed, and are different from shapes of contours of the touch electrodes located in the main touch region A2.

In the touch substrate 100 of the above embodiments of the present disclosure, the center of the adjustment connecting unit 32 is set to be farther from the center D of the mounting hole H1 than the hole edge reference point P, and the shapes of the contours of the touch electrodes electrically connected to the adjustment connecting unit 32 are changed. As a result, the adjustment connecting unit 32 is electrically connected to two first touch electrodes 11 adjacent thereto and two second touch electrodes adjacent thereto, and the problem of poor antistatic capability of the touch electrodes due to the use of the bridge to electrically connect the touch electrodes may be avoided.

In addition, of the two first touch electrodes 11 electrically connected to the adjustment connecting unit 32, a contour circumference of a first touch electrode 11 closer to the mounting hole H1 (the first touch electrode 11 located around the mounting hole H1) is increased. Of the two second touch electrodes 21 electrically connected to the adjustment connecting unit 32, a contour circumference of a second touch electrode 21 closer to the mounting hole H1 (the second touch electrode 21 located around the mounting hole H1) is increased. As a result, a facing area of the first sub-electrode 110 and the second sub-electrode 210 in the capacitor unit C where the adjustment connecting unit 32 is located is increased.

By increasing the facing area of the first sub-electrode 110 and the second sub-electrode 210 in the capacitor unit C where the adjustment connecting unit 32 is located, it is possible to reduce a difference between the above-mentioned facing area and a facing area of a first sub-electrode 110 and a second sub-electrode 210 in a capacitor unit C in the main touch region A2, and reduce a difference between a mutual capacitance value of the capacitor unit C where the adjustment connecting unit 32 is located and a mutual capacitance value of the capacitor unit C in the main touch region A2. As a result, the linearity of the scribed line around the mounting hole H1 may be improved, and touch precision of the periphery of the mounting hole H1 of the touch substrate 100 may be improved.

In some embodiments, as shown in FIG. 3A, a maximum dimension of the first touch electrode 11 in the first direction X is a width of the first touch electrode 11, and a maximum dimension of the second touch electrode 21 in the second direction Y is a width of the second touch electrode 21. By adjusting the width of the first touch electrode 11, or adjusting the width of the second touch electrode 21, or adjusting the width of the first touch electrode 11 and the width of the second touch electrode 21, it is possible to prevent the connecting unit 30 from being removed in a process of forming the hole inside the display panel 300. As a result, the problem of the poor antistatic capability of the touch electrodes due to the use of the bridge to electrically connect the touch electrodes may be avoided.

How to select a hole edge connecting unit 31 as an adjustment connecting unit 32 will be explained below with reference to drawings.

In some embodiments, as shown in FIG. 3A, a first hole edge connecting unit 33, a second hole edge connecting unit 34, a third hole edge connecting unit 35 and a fourth hole edge connecting unit 36 are disposed around the mounting hole H1 in the hole edge region A1.

In the first direction X, the first hole edge connecting unit 33 and the third hole edge connecting unit 35 are adjacent to each other and are electrically connected to a same first touch electrode 11, and the second hole edge connecting unit 34 and the fourth hole edge connecting units 36 are adjacent to each other and are electrically connected to another same first touch electrode 11. In the second direction Y, the first hole edge connecting unit 33 and the second hole edge connecting unit 34 are adjacent to each other and are electrically connected to a same second touch electrode 21, and the third hole edge connecting unit 35 and the fourth hole edge connecting unit 36 are adjacent to each other and are electrically connected to another same second touch electrode 21.

In some embodiments, as shown in FIG. 3A, a hole edge reference point P corresponding to the first hole edge connecting unit 33 is a first hole edge reference point P1, a hole edge reference point P corresponding to the second hole edge connecting unit 34 is a second hole edge reference point P2, a hole edge reference point P corresponding to the third hole edge connecting unit 35 is a third hole edge reference point P3, and a hole edge reference point P corresponding to the fourth hole edge connecting unit 36 is a fourth hole edge reference point P4.

In the direction parallel to the plane of the substrate 101, of the first hole edge connecting unit 33, the second hole edge connecting unit 34, the third hole edge connecting unit 35 and the fourth hole edge connecting unit 36, at least one hole edge connecting unit 31 is an adjustment connecting unit 32. A distance between a center of the adjustment connecting unit 32 and the center O of the mounting hole H1 is greater than a distance between a hole edge reference point P corresponding to the adjustment connecting unit 32 and the center O of the mounting hole H1. Of the first hole edge connecting unit 33, the second hole edge connecting unit 34, the third hole edge connecting unit 35 and the fourth hole edge connecting unit 36, centers of the other hole edge connecting units 31 other than the adjustment connecting unit 32 each overlap with a correspond hole edge reference point P.

For example, in the direction parallel to the plane of the substrate 101, of the first hole edge connecting unit 33, the second hole edge connecting unit 34, the third hole edge connecting unit 35 and the fourth hole edge connecting unit 36, one hole edge connecting unit 31 is the adjustment connecting unit 32.

For example, as shown in FIG. 3A, the second hole edge connecting unit 34 is selected as the adjustment connecting unit 32. The position of the second hole edge connecting unit 34 is adjusted, so that a distance between a center D2 (D-32) of the second hole edge connecting unit 34 and the center D of the mounting hole H1 is greater than a distance between the second hole edge reference point P2 and the center D of the mounting hole H1. A center of the first hole edge connecting unit 33 overlaps with the first hole edge reference point P1, a center of the third hole edge connecting unit 35 overlaps with the third hole edge reference point P3, and a center of the fourth hole edge connecting unit 36 overlaps with the four hole edge reference points P4. That is, positions of the first hole edge connecting unit 33, the third hole edge connecting unit 35 and the fourth hole edge connecting unit 36 are not adjusted.

It will be understood that, in the related art, a position of the mounting hole is closer to a capacitor unit where a second hole edge reference point is located than capacitor units where a first hole edge reference point, a third hole edge reference point and a fourth hole edge reference point are located. There is more loss of patterns of touch sub-electrodes, proximate to the mounting hole, in the capacitor unit, resulting in a small mutual capacitance value of the capacitor unit.

A facing area of a first sub-electrode 110 and a second sub-electrode 210 in the capacitor unit C where the second hole edge connecting unit 34 is located is increased through the above arrangement, thereby increasing a mutual capacitance value of the capacitor unit C where the second hole edge connecting unit 34 is located, and decreasing a difference between the mutual capacitance value of the capacitor unit C where the second hole edge connecting unit 34 is located and the mutual capacitance value of the capacitor unit C in the main touch region A2. As a result, the linearity of the scribed line around the mounting hole H1 on the touch substrate 100 may be improved, and the touch precision of the periphery of the mounting hole H1 of the touch substrate 100 may be improved.

For another example, the position of the mounting hole H1 is closer to a capacitor unit C where the first hole edge reference point P1 is located than capacitor units C where the second hole edge reference point P2, the third hole edge reference point P3 and the fourth hole edge reference point P4 are located. In this case, the first hole edge connecting unit 33 may be selected as the adjustment connecting unit 32 to increase a mutual capacitance value of the capacitor unit C where the first hole edge connecting unit 33 is located.

For yet another example, the position of the mounting hole H1 is closer to the capacitor unit C where the third hole edge reference point P3 is located than capacitor units C where first hole edge reference point P1, the second hole edge reference point P2 and the fourth hole edge reference point P4 are located. In this case, the third hole edge connecting unit 35 may be selected as the adjustment connecting unit 32 to increase a mutual capacitance value of the capacitor unit C where the third hole edge connecting unit 35 is located.

For yet another example, the position of the mounting hole H1 is closer to the capacitor unit C where the fourth hole edge reference point P4 is located than capacitor units C where first hole edge reference point P1, the second hole edge reference point P2 and the third hole edge reference point P3 are located. In this case, the fourth hole edge connecting unit 36 may be selected as the adjustment connecting unit 32 to increase a mutual capacitance value of the capacitor unit C where the fourth hole edge connecting unit 36 is located.

For example, in the direction parallel to the plane of the substrate 101, of the first hole edge connecting unit 33, the second hole edge connecting unit 34, the third hole edge connecting unit 35 and the fourth hole edge connecting unit 36, two hole edge connecting units are adjustment connecting units 32.

Figure 3B:
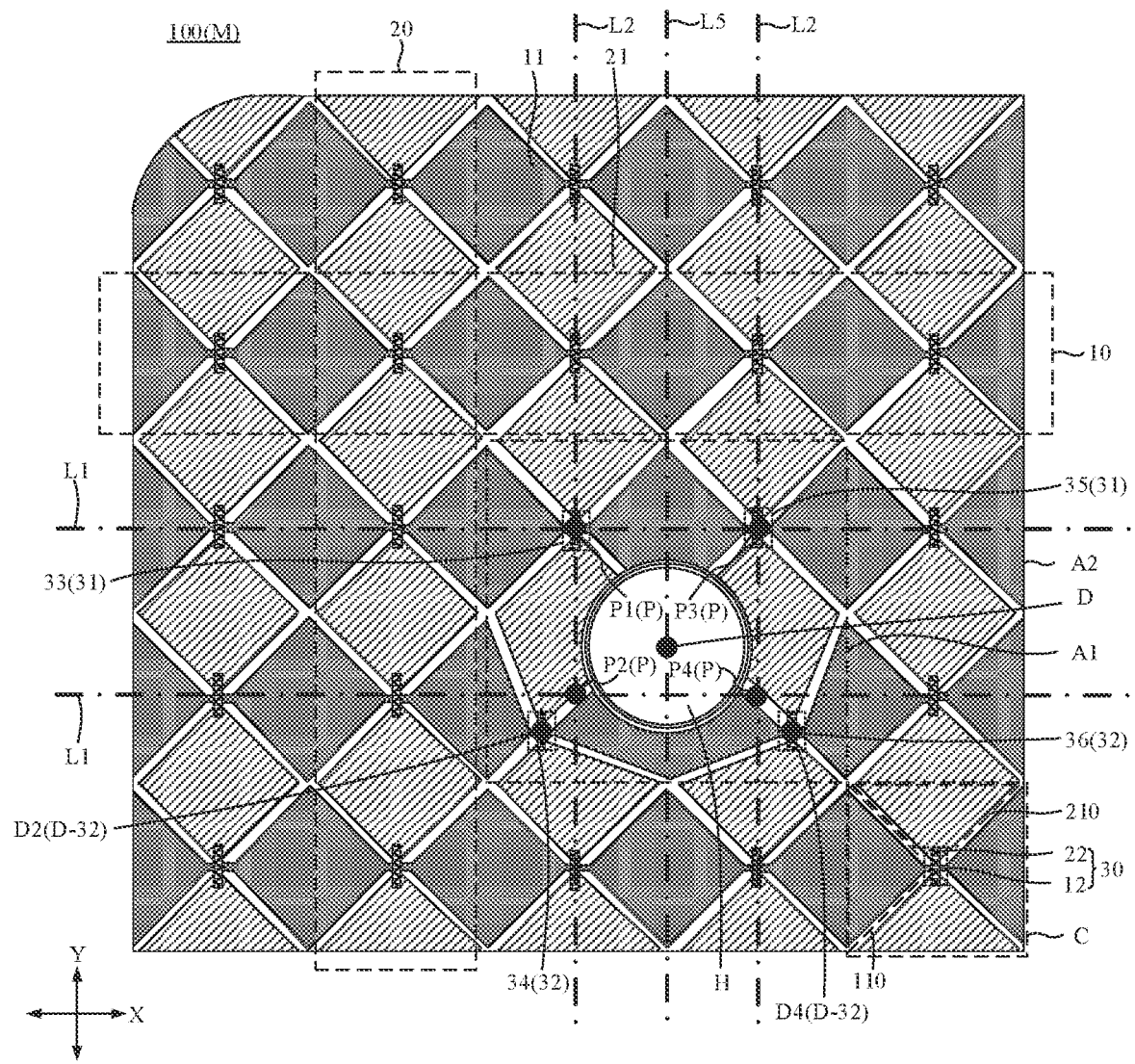
FIG. 3B is a top view of another touch substrate, in accordance with some embodiments of the present disclosure.

For example, as shown in FIG. 3B, the second hole edge connecting unit 34 and the fourth hole edge connecting unit 36 are selected as adjustment connecting units 32. Positions of the second hole edge connecting unit 34 and the fourth hole edge connecting unit 36 are adjusted, so that the distance between the center D2 (D-32) of the second hole edge connecting unit 34 and the center D of the mounting hole H1 is greater than the distance between the second hole edge reference point P2 and the center D of the mounting hole H1 and the distance between the center D4 (D-32) of the fourth hole edge connecting unit 36 and the center D of the mounting hole H1 is greater than the distance between the fourth hole edge reference point P4 and the center D of the mounting hole H1. The center of the first hole edge connecting unit 33 overlaps with the first hole edge reference point P1, and the center of the third hole edge connecting unit 35 overlaps with the third hole edge reference point P3. That is, positions of the first hole edge connecting unit 33 and the third hole edge connecting unit 35 are not adjusted.

It will be understood that, in the related art, the position of the mounting hole is closer to capacitor units where the second hole edge reference point and the fourth hole edge reference point are located than capacitor units where the first hole edge reference point and the third hole edge reference point are located. Therefore, there is more loss of patterns of touch sub-electrodes, proximate to the mounting hole, in the capacitor units where the second hole edge reference point and the fourth hole edge reference point are located, resulting in small mutual capacitance values of the two capacitor units.

A facing area of a first sub-electrode 110 and a corresponding second sub-electrode 210 in each of the capacitor units C where the second hole edge connecting unit 34 and the fourth hole edge connecting unit 36 are located is increased through the above arrangement, thereby increasing mutual capacitance values of the capacitor units C where the second hole edge connecting unit 34 and the fourth hole edge connecting unit 36 are located, reducing a difference between the mutual capacitance value of the capacitor unit C where the second hole edge connecting unit 34 is located and the mutual capacitance value of the capacitor unit C in the main touch region A2, and reducing a difference between the mutual capacitance value of the capacitance unit C where the fourth hole edge connecting unit 36 is located and the mutual capacitance value of the capacitor unit C in the main touch region A2. As a result, the linearity of the scribed line around the mounting hole H1 on the touch substrate 100 may be improved, and the touch precision of the periphery of the mounting hole H1 of the touch substrate 100 may be improved.

For another example, the position of the mounting hole H1 is closer to capacitor units C where the third hole edge reference point P3 and the fourth hole edge reference point P4 are located than capacitor units C where the first hole edge reference point P1 and the second hole edge reference point P2 are located. In this case, the third hole edge connecting unit 35 and the fourth hole edge connecting unit 36 may be selected as adjustment connecting units 32 to increase mutual capacitance values of capacitor units C where the third hole edge connecting unit 35 and the fourth hole edge connecting unit 36 are located.

Figure 3C:
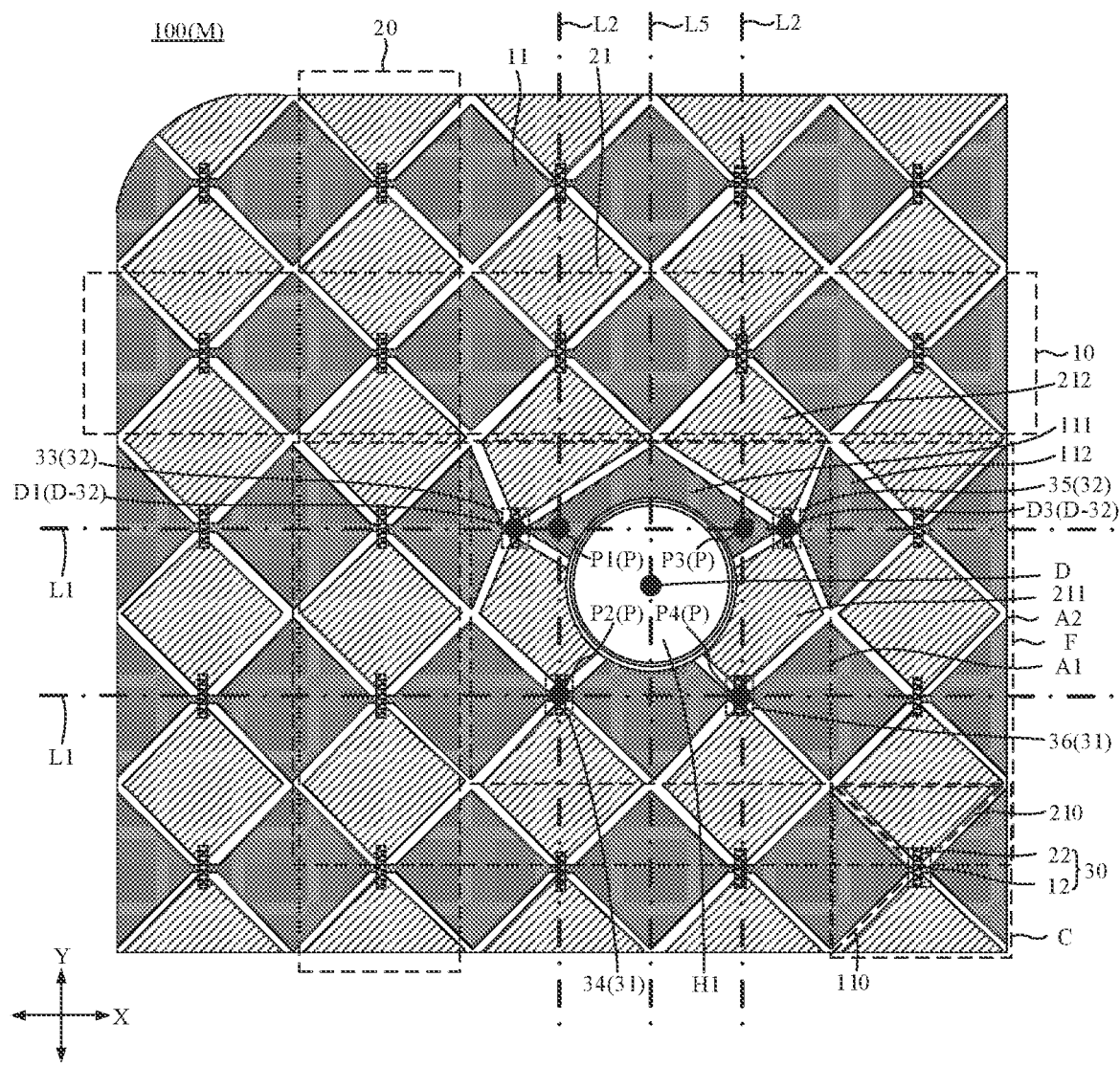
FIG. 3C is a top view of yet another touch substrate, in accordance with some embodiments of the present disclosure.
Figure 3D:
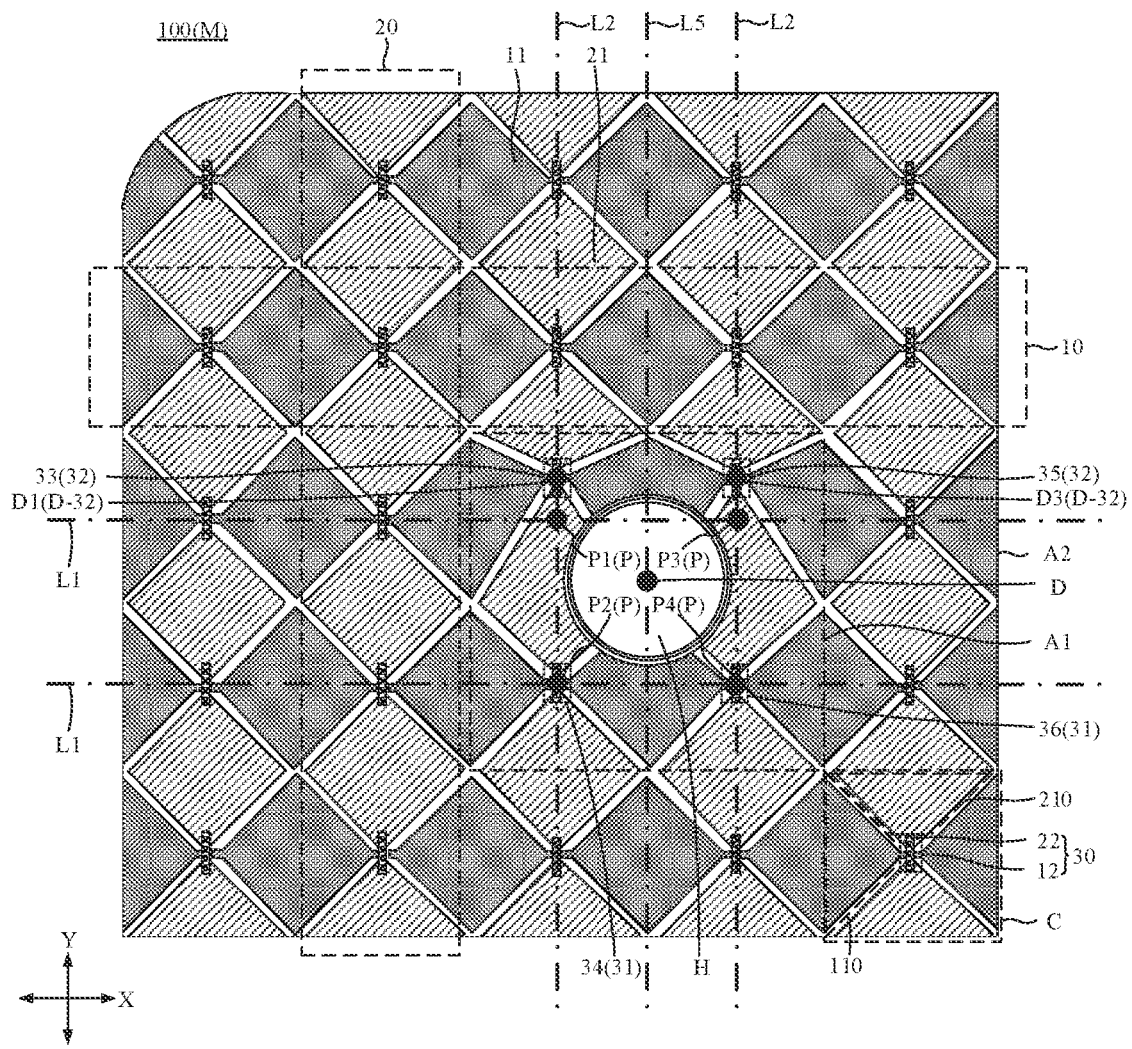
FIG. 3D is a top view of yet another touch substrate, in accordance with some embodiments of the present disclosure.

For yet another example, as shown in FIGS. 3C and 3D, the position of the mounting hole H1 is closer to capacitor units C where the first hole edge reference point P1 and the third hole edge reference point P3 are located than capacitor units C where the second hole edge reference point P2 and the fourth hole edge reference point P4 are located. In this case, the first hole edge connecting unit 33 and the third hole edge connecting unit 35 may be selected as adjustment connecting units 32 to increase mutual capacitance values of capacitor units C where the first hole edge connecting unit 33 and the third hole edge connecting unit 35 are located.

For yet another example, the position of the mounting hole H1 is closer to capacitor units C where the first hole edge reference point P1 and the second hole edge reference point P2 are located than capacitor units C where the third hole edge reference point P3 and the fourth hole edge reference point P4 are located. In this case, the first hole edge connecting unit 33 and the second hole edge connecting unit 34 may be selected as adjustment connecting units 32 to increase mutual capacitance values of capacitor units C where the first hole edge connecting unit 33 and the second hole edge connecting unit 34 are located.

For example, in the direction parallel to the plane of the substrate 101, of the first hole edge connecting unit 33, the second hole edge connecting unit 34, the third hole edge connecting unit 35 and the fourth hole edge connecting unit 36, three hole edge connecting units are adjustment connecting units 32.

Figure 3E:
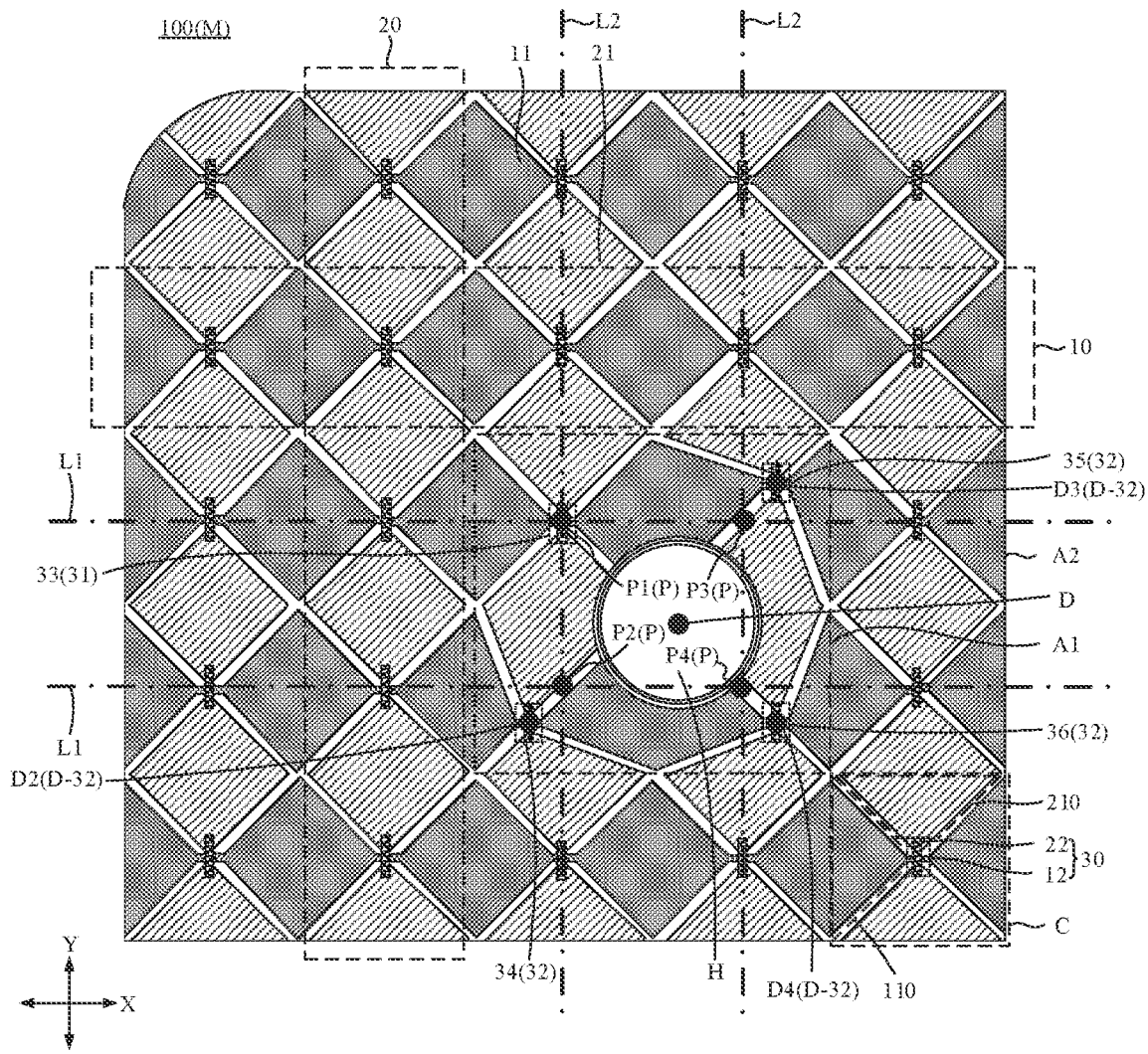
FIG. 3E is a top view of yet another touch substrate, in accordance with some embodiments of the present disclosure.

For example, as shown in FIG. 3E, the second hole edge connecting unit 34, the third hole edge connecting unit 35 and the fourth hole edge connecting unit 36 are selected as adjustment connecting units 32, and positions of the second hole edge connecting unit 34, the third hole edge connecting unit 35 and the fourth hole edge connecting unit 36 are adjusted. As a result, the distance between the center D2 (D-32) of the second hole edge connecting unit 34 and the center D of the mounting hole H1 is greater than the distance between the second hole edge reference point P2 and the center D of the mounting hole H1, the distance between the center D3 (D-32) of the third hole edge connecting unit 35 and the center D of the mounting hole H1 is greater than the distance between the third hole edge reference point P3 and the center D of the mounting hole H1 and the distance between the center D4 (D-32) of the fourth hole edge connecting unit 36 and the center D of the mounting hole H1 is greater than the distance between the fourth hole edge reference point P4 and the center D of the mounting hole H1. The center of the first hole edge connecting unit 33 overlaps with the first hole edge reference point P1, that is, the position of the first hole edge connecting unit 33 is not adjusted.

It will be understood that, in the related art, the position of the mounting hole is closer to capacitor units where the second hole edge reference point, the third hole edge reference point and the fourth hole edge reference point are located than the capacitor unit where the first hole edge reference point is located. There is more loss of patterns of touch sub-electrodes, proximate to the mounting hole, in the capacitor units where the second hole edge reference point, the third hole edge reference point and the fourth hole edge reference point are located, resulting in small mutual capacitance values of the three capacitor units.

A facing area of a first sub-electrode 110 and a corresponding second sub-electrode 210 in each of the capacitor units C where the second hole edge connecting unit 34, the third hole edge connecting unit 35 and the fourth hole edge connecting unit 36 are located is increased through the above arrangement. Therefore, mutual capacitance values of the capacitor units C where the second hole edge connecting unit 34, the third hole edge connecting unit 35 and the fourth hole edge connecting unit 36 are located may be increased, the difference between the mutual capacitance value of the capacitor unit C where the second hole edge connecting unit 34 is located and the mutual capacitance value of the capacitor unit C in the main touch region A2 may be reduced, the difference between the mutual capacitance value of the capacitor unit C where the third hole edge connecting unit 35 is located and the mutual capacitance value of the capacitor unit C in the main touch region A2 may be reduced, and the difference between the mutual capacitance value of the capacitor unit C where the fourth hole edge connecting unit 36 is located and the mutual capacitance value of the capacitor unit C in the main touch region A2 may be reduced. As a result, the linearity of the scribed line around the mounting hole H1 on the touch substrate 100 may be improved, and the touch precision of the periphery of the mounting hole H1 of the touch substrate 100 may be improved.

For another example, the position of the mounting hole H1 is closer to capacitor units C where the first hole edge reference point P1, the third hole edge reference point P3 and the fourth hole edge reference point P4 are located than the capacitor unit C where the second hole edge reference point P2 is located. In this case, the first hole edge connecting unit 33, the third hole edge connecting unit 35 and the fourth hole edge connecting unit 36 may be selected as adjustment connecting units 32 to increase mutual capacitance values of the capacitor units C where the first hole edge connecting unit 33, the third hole edge connecting unit 35 and the fourth hole edge connecting unit 36 are located.

For yet another example, the position of the mounting hole H1 is closer to the capacitor units C where the first hole edge reference point P1, the second hole edge reference point P2 and the fourth hole edge reference point P4 are located than the capacitor unit C where the third hole edge reference point P3 is located. In this case, the first hole edge connecting unit 33, the second hole edge connecting unit 34 and the fourth hole edge connecting unit 36 may be selected as adjustment connecting units 32 to increase mutual capacitance values of the capacitor units C where the first hole edge connecting unit 33, the second hole edge connecting unit 34 and the fourth hole edge connecting unit 36 are located.

For yet another example, the position of the mounting hole H1 is closer to the capacitor units C where the first hole edge reference point P1, the second hole edge reference point P2 and the third hole edge reference point P3 are located than the capacitor unit C where the fourth hole edge reference point P4 is located. In this case, the first hole edge connecting unit 33, the second hole edge connecting unit 34 and the third hole edge connecting unit 35 may be selected as adjustment connecting units 32 to increase mutual capacitance values of the capacitor units C where the first hole edge connecting unit 33, the second hole edge connecting unit 34 and the third hole edge connecting unit 35 are located.

For example, in the direction parallel to the plane of the substrate 101, the first hole edge connecting unit 33, the second hole edge connecting unit 34, the third hole edge connecting unit 35 and the fourth hole edge connecting unit 36 are all adjustment connecting units 32.

Figure 3F:
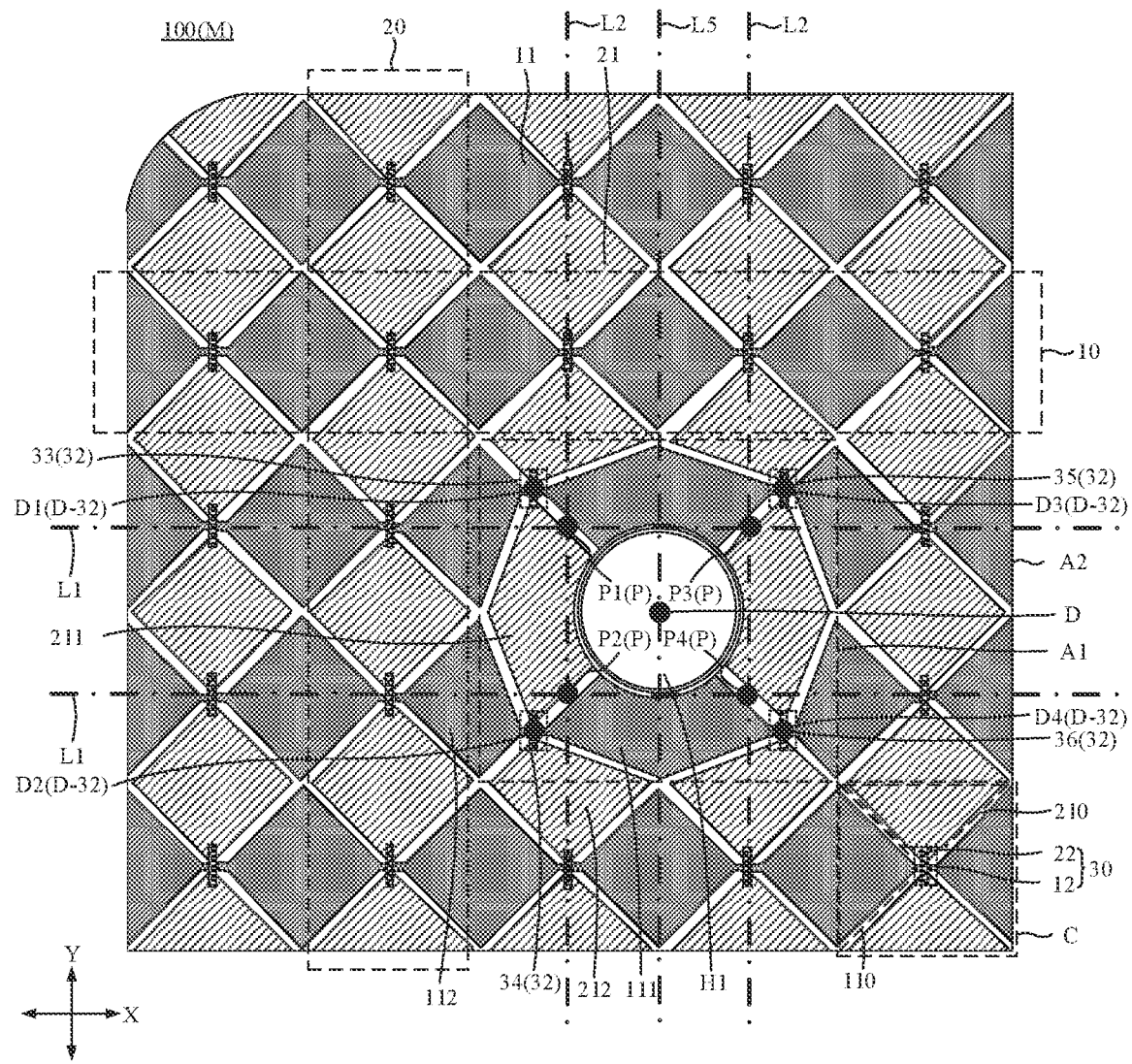
FIG. 3F is a top view of yet another touch substrate, in accordance with some embodiments of the present disclosure.

For example, as shown in FIG. 3F, the first hole edge connecting unit 33, the second hole edge connecting unit 34, the third hole edge connecting unit 35 and the fourth hole edge connecting unit 36 are selected as adjustment connecting units 32, and positions of the first hole edge connecting unit 33, the second hole edge connecting unit 34, the third hole edge connecting unit 35 and the fourth hole edge connecting unit 36 are adjusted. As a result, the distance between the center D1 (D-32) of the first hole edge connecting unit 33 and the center D of the mounting hole H1 is greater than the distance between the first hole edge reference point P1 and the center D of the mounting hole H1, the distance between the center D2 (D-32) of the second hole edge connecting unit 34 and the center D of the mounting hole H1 is greater than the distance between the second hole edge reference point P2 and the center D of the mounting hole H1, the distance between the center D3 (D-32) of the third hole edge connecting unit 35 and the center D of the mounting hole H1 is greater than the distance between the third hole edge reference point P3 and the center D of the mounting hole H1, and the distance between the center D4 (D-32) of the fourth hole edge connecting unit 36 and the center D of the mounting hole H1 is greater than the distance between the fourth hole edge reference point P4 and the center D of the mounting hole H1.

It will be understood that, in the related art, due to arrangement of the mounting hole, patterns of touch sub-electrodes, proximate to the mounting hole, in capacitor units where the first hole edge connecting unit 33, the second hole edge connecting unit 34, the third hole edge connecting unit 35 and the fourth hole edge connecting unit 36 are located are incomplete, resulting in small mutual capacitance values of the four capacitor units.

A facing area of a first sub-electrode 110 and a corresponding second sub-electrode 210 in each of the capacitor units C where the first hole edge connecting unit 33, the second hole edge connecting unit 34, the third hole edge connecting unit 35 and the fourth hole edge connecting unit 36 are located is increased through the above arrangement. Therefore, mutual capacitance values of the capacitor units C where the first hole edge connecting unit 33, the second hole edge connecting unit 34, the third hole edge connecting unit 35 and the fourth hole edge connecting unit 36 are located may be increased, the difference between the mutual capacitance value of the capacitor unit C where the first hole edge connecting unit 33 is located and the mutual capacitance value of the capacitor unit C in the main touch region A2 may be reduced, the difference between the mutual capacitance value of the capacitor unit C where the second hole edge connecting unit 34 is located and the mutual capacitance value of the capacitor unit C in the main touch region A2 may be reduced, the difference between the mutual capacitance value of the capacitor unit C where the third hole edge connecting unit 35 is located and the mutual capacitance value of the capacitor unit C in the main touch region A2 may be reduced, and the difference between the mutual capacitance value of the capacitor unit C where the fourth hole edge connecting unit 36 is located and the mutual capacitance value of the capacitor unit C in the main touch region A2 may be reduced. As a result, the linearity of the scribed line around the mounting hole H1 on the touch substrate 100 may be improved, and the touch precision of the periphery of the mounting hole H1 of the touch substrate 100 may be improved.

In some embodiments, in the direction parallel to the plane of the substrate 101, of the first hole edge connecting unit 33, the second hole edge connecting unit 34, the third hole edge connecting unit 35 and the fourth hole edge connecting unit 36, distances between centers of at least two hole edge connecting units 31 and the center D of the mounting hole H1 are different.

It will be understood that, of the first hole edge connecting unit 33, the second hole edge connecting unit 34, the third hole edge connecting unit 35 and the fourth hole edge connecting unit 36, at least one hole edge connecting unit 31 is set as the adjustment connecting unit 32. The adjustment connecting unit 32 is farther from the mounting hole H1 than the corresponding hole edge reference point P, so that the distance between the center of the adjustment connecting unit 32 and the center D of the mounting hole H1 may be different from a distance between a center of the any hole edge connecting unit 31 other than the adjustment connecting unit 32 and the center D of the mounting hole H1.

In some embodiments, as shown in FIG. 3B, the second hole edge connecting unit 34 and the fourth hole edge connecting unit 36 are the adjustment connecting units 32, and the center D2 (D-32) of the second hole edge connecting unit 34 and the center D4 (D-32) of the fourth hole edge connecting unit 36 are symmetrical with respect to a line L5 passing through the center D of the mounting hole H1 in the second direction Y.

It will be understood that the second hole edge connecting unit 34 and the fourth hole edge connecting unit 36 are selected as the adjustment connecting units 32. The positions of the second hole edge connecting unit 34 and the fourth hole edge connecting unit 36 are adjusted, so that the center D2 (D-32) of the second hole edge connecting unit 34 and the center D4 (D-32) of the fourth hole edge connecting unit 36 are symmetrical with respect to the straight line L5 passing through the center D of the mounting hole H1 in the second direction Y. Therefore, the pattern of the touch sub-electrodes in the capacitor unit C where the second hole edge connecting unit 34 is located is symmetrical with the pattern of the touch sub-electrodes in the capacitor unit C where the fourth hole edge connecting unit 36 is located with respect to the straight line L5. As a result, the mutual capacitance value of the capacitor unit C where the second hole edge connecting unit 34 is located is approximately equal to the mutual capacitance value of the capacitor unit C where the fourth hole edge connecting unit 36 is located, which is beneficial to improve the linearity of the scribed line on the two capacitor units C of the touch substrate 100.

In some embodiments, as shown in FIGS. 3C and 3D, the first hole edge connecting unit 33 and the third hole edge connecting unit 35 are the adjustment connecting units 32, and the center D1 (D-32) of the first hole edge connecting unit 33 and the center D3 (D-32) of the third hole edge connecting unit 35 are symmetrical with respect to the line L5 passing through the center D of the mounting hole H1 in the second direction Y.

It will be understood that the first hole edge connecting unit 33 and the third hole edge connecting unit 35 are selected as the adjustment connecting units 32. The positions of the first hole edge connecting unit 33 and the third hole edge connecting unit 35 are adjusted, so that the center D1 (D-32) of the first hole edge connecting unit 33 and the center D3 (D-32) of the third hole edge connecting unit 35 are symmetrical with respect to the straight line L5 passing through the center D of the mounting hole H1 in the second direction Y. Therefore, the pattern of the touch sub-electrodes in the capacitor unit C where the first hole edge connecting unit 33 is located is symmetrical with the pattern of the touch sub-electrodes in the capacitor unit C where the third hole edge connecting unit 35 is located with respect to the straight line L5. As a result, the mutual capacitance value of the capacitor unit C where the first hole edge connecting unit 33 is located is approximately equal to the mutual capacitance value of the capacitor unit C where the third hole edge connecting unit 35 is located, which is beneficial to improve the linearity of the scribed line on the two capacitor units C of the touch substrate 100.

In some embodiments, as shown in FIG. 3F, the first hole edge connecting unit 33, the second hole edge connecting unit 34, the third hole edge connecting unit 35 and the fourth hole edge connecting unit 36 are all the adjustment connecting units 32. The center D1 (D-32) of the first hole edge connecting unit 33 and the center D3 (D-32) of the third hole edge connecting unit 35 are symmetrical with respect to the straight line L5 passing through the center D of the mounting hole H1 in the second direction Y, and the center D2 (D-32) of the second hole edge connecting unit 34 and the center D4 (D-32) of the fourth hole edge connecting unit 36 are symmetrical with respect to the straight line L5 passing through the center D of the mounting hole H1 in the second direction Y.

Through the above arrangement, the mutual capacitance value of the capacitor unit C where the first hole edge connecting unit 33 is located is approximately equal to the mutual capacitance value of the capacitor unit C where the third hole edge connecting unit 35 is located, and the mutual capacitance value of the capacitor unit C where the second hole edge connecting unit 34 is located is approximately equal to the mutual capacitance value of the capacitor unit C where the fourth hole edge connecting unit 36 is located, which is beneficial to improve the linearity of the scribed line on the capacitor units C around the mounting hole H1.

In some embodiments, as shown in FIG. 3A, in the direction parallel to the plane of the substrate 101, the center D-32 of the adjustment connecting unit 32 is not on the first reference line L1 and the second reference line L2.

For example, a line connecting the center D-32 of the adjustment connecting unit 32 and a center O5 of at least one first connecting portion 12, in the main touch region A2, of the first touch unit 10 corresponding to the adjustment connecting unit 32 is a connecting line E1. A smaller included angle between the connecting line E1 and the first reference line L1 is an acute angle. For example, the included angle may be 10°, 20°, 30°, 40°, 50°, 60°, 70° or 80°.

A line connecting the center D-32 of the adjustment connecting unit 32 and a center O6 of at least one second connecting portion 22, in the main touch region A2, of the second touch unit 20 corresponding to the adjustment connecting unit 32 is a connecting line E2. A smaller included angle between the connecting line E2 and the second reference line L2 is an acute angle. For example, the included angle may be 10°, 20°, 30°, 40°, 50°, 60°, 70° or 80°.

In some embodiments, as shown in FIGS. 3O and 3D, in the direction parallel to the plane of the substrate 101, the center of the adjustment connecting unit 32 is on the first reference line L1 or the second reference line L2. That is, the adjustment connecting unit 32 is obtained by adjusting the position of the hole edge connecting unit 31 in an extension direction of the first reference line L1 or an extension direction of the second reference line L2.

For example, as shown in FIG. 3C, in the direction parallel to the plane of the substrate 101, the center of the adjustment connecting unit 32 is on the first reference line L1. That is, the positions of the first hole edge connecting unit 33 and the third hole edge connecting unit 35 are adjusted in the extension direction of the first reference line L1, so that the distance between the first hole edge connecting unit 33 and the center D of the mounting hole H1 is greater than the distance between the first hole edge reference point P1 and the center D of the mounting hole H1, and the distance between the third hole edge connecting unit 35 and the center D of the mounting hole H1 is greater than the distance between the third hole edge reference point P3 and the center D of the mounting hole H1. In this case, the first hole edge connecting unit 33 and the third hole edge connecting unit 35 are the adjustment connecting units 32.

For example, as shown in FIG. 3D, in the direction parallel to the plane of the substrate 101, the center of the adjustment connecting unit 32 is on the second reference line L2. That is, the positions of the first hole edge connecting unit 33 and the third hole edge connecting unit 35 are adjusted in the extension direction of the second reference line L2, so that the distance between the first hole edge connecting unit 33 and the center D of the mounting hole H1 is greater than the distance between the first hole edge reference point P1 and the center D of the mounting hole H1 and the distance between the third hole edge connecting unit 35 and the center D of the mounting hole H1 is greater than the distance between the third hole edge reference point P3 and the center D of the mounting hole H1. In this case, the first hole edge connecting unit 33 and the third hole edge connecting unit 35 are the adjustment connecting units 32.

In some embodiments, a ratio of the distance between the center of the adjustment connecting unit 32 and the center of the mounting hole H1 to the distance between a hole edge reference point P corresponding to the adjustment connecting unit 32 and the center of the mounting hole H1 is greater than 1, and less than or equal to 1.9. For example, the ratio is 1.09, 1.2, 1.3, 1.4, 1.5, 1.6, 1.7, 1.75, 1.8, 1.85, or 1.9.

In some embodiments, in the direction parallel to the plane of the substrate 101, the distance between the center of the adjustment connecting unit 32 and the center D of the mounting hole H1 is in a range of 2.5 mm to 3.5 mm, inclusive. For example, the distance is 2.5 mm, 2.6 mm, 3 mm, 3.3 mm or 3.5 mm.

In some embodiments, a difference between mutual capacitance values of the capacitor unit C, before being touched and after being touched, where the adjustment connecting unit 32 is located is C1. A difference between mutual capacitance values of the capacitor unit C, before being touched and after being touched, located in the main touch region A2 is C2. A ratio of C1 to C2 is in a range of 0.55 to 0.58, inclusive. For example, the ratio is 0.55, 0.56, 0.565, 0.57 or 0.58.

Shapes of the first sub-electrode 110 of the first touch electrode 11 and the second sub-electrode 210 of the second touch electrode 21 are described below.

In some embodiments, as shown in FIG. 3A, shapes of two adjacent first sub-electrodes 110 electrically connected to a same adjustment connecting unit 32 are different from a shape of the first sub-electrode 110 located in the main touch region A2. In addition, shapes of two adjacent second sub-electrodes 210 electrically connected to another adjustment connecting unit 32 are different from a shape of the second sub-electrode 210 located in the main touch region A2.

It will be understood that the position of the adjustment connecting unit 32 is changed relative to the position of the corresponding hole edge reference point P, so the shapes of the touch electrodes electrically connected to the adjustment connecting unit 32 are changed. As a result, the shapes of the touch sub-electrodes electrically connected to the adjustment connecting unit 32 are different from the shapes of the touch sub-electrodes located in the main touch region A2.

In some embodiments, as shown in FIG. 3A, of two adjacent first sub-electrodes 110 and two adjacent second sub-electrodes 210 that are electrically connected to a same adjustment connecting unit 32, shapes of contours, proximate to each other, of the first sub-electrode 110 and the second sub-electrode 210 are complementary to each other, which may increase the facing area of the first sub-electrode 110 and the second sub-electrode 210, and thus increase the mutual capacitance value of the capacitor unit C where the adjustment connecting unit 32 is located.

The touch electrodes electrically connected to the same adjustment connecting unit 32 are described below.

In some embodiments, as shown in FIG. 3A, the two adjacent first touch electrodes 11 electrically connected to the same adjustment connecting unit 32 are a first electrode 111 and a second electrode 112 respectively, and the second electrode 112 is farther from the mounting hole H1 than the first electrode 111. The two adjacent second touch electrodes 21 electrically connected to the same adjustment connecting unit 32 are a third electrode 211 and a fourth electrode 212 respectively, and the fourth electrode 212 is farther from the mounting hole H1 than the third electrode 211.

Compared with the related art in FIG. 21, FIG. 3A may be understood as follows. The position of the hole edge connecting unit 31 is adjusted, so that the hole edge connecting unit 31 is farther from the mounting hole H1 than the corresponding hole edge reference point 111, and the hole edge connecting unit 31 after the position adjustment is the adjustment connecting unit 32. Correspondingly, shapes of contours of a first electrode 111', a second electrode 112', a third electrode 211' and a fourth electrode 212' that are located around the mounting hole H' in FIG. 21 are changed to obtain the first electrode 111, the second electrode 112, the third electrode 211 and the fourth electrode 212 shown in FIG. 3A.

A ratio of an area of a region defined by an outer contour of the first electrode 111 to an area of a region defined by an outer contour of the first touch electrode 11 located in the main touch region A2 is greater than or equal to 0.5. For example, the ratio is 0.5, 0.7, 0.75, 0.86 or 0.9.

For example, the ratio of the area of the region defined by the outer contour of the first electrode 111 to the area of the region defined by the outer contour of the first touch electrode 11 located in the main touch region A2 is greater than or equal to 0.7. For example, the ratio is 0.7, 0.76, 0.8, 0.85, or 0.9.

A ratio of an area of a region defined by an outer contour of the second electrode 112 to the area of the region defined by the outer contour of the first touch electrode 11 located in the main touch region A2 is greater than or equal to 0.5. For example, the ratio is 0.5, 0.7, 0.75, 0.86 or 0.9.

For example, the ratio of the area of the region defined by the outer contour of the second electrode 112 to the area of the region defined by the outer contour of the first touch electrode 11 located in the main touch region A2 is greater than or equal to 0.7. For example, the ratio is 0.7, 0.76, 0.8, 0.85, or 0.9.

A ratio of an area of a region defined by an outer contour of the third electrode 211 to an area of a region defined by an outer contour of the second touch electrode 21 located in the main touch region A2 is greater than or equal to 0.5. For example, the ratio is 0.5, 0.7, 0.75, 0.86 or 0.9.

For example, the ratio of the area of the region defined by the outer contour of the third electrode 211 to the area of the region defined by the outer contour of the second touch electrode 21 located in the main touch region A2 is greater than or equal to 0.7. For example, the ratio is 0.7, 0.75, 0.8, 0.85, or 0.9.

A ratio of an area of a region defined by an outer contour of the fourth electrode 212 to the area of the region defined by the outer contour of the second touch electrode 21 located in the main touch region A2 is greater than or equal to 0.5. For example, the ratio is 0.5, 0.7, 0.75, 0.86 or 0.9.

For example, the ratio of the area of the region defined by the outer contour of the fourth electrode 212 to the area of the region defined by the outer contour of the second touch electrode 21 located in the main touch region A2 is greater than or equal to 0.7. For example, the ratio is 0.7, 0.76, 0.8, 0.85, or 0.9.

Compared with the first electrode 111' in FIG. 21, in the embodiments of the present disclosure, the area of the first electrode 111 is increased, and a contour circumference of the first electrode 111 is increased; compared with the second electrode 112' in FIG. 21, in the embodiments of the present disclosure, the area of the second electrode 112 is reduced, and a contour circumference of the second electrode 112 is reduced; compared with the third electrode 211' in FIG. 21, in the embodiments of the present disclosure, the area of the third electrode 211 is increased, and a contour circumference of the third electrode 211 is increased; compared with the fourth electrode 212' in FIG. 21, in the embodiments of the present disclosure, the area of the fourth electrode 212 is reduced, and a contour circumference of the fourth electrode 212 is reduced.

Through the above arrangement, a difference between the area of the first electrode 111 and the area of the second electrode 112 and a difference between the contour circumference of the first electrode 111 and the contour circumference of the second electrode 112 may be reduced, a difference between the area of the third electrode 211 and the area of the fourth electrode 212 and a difference between the contour circumference of the third electrode 211 and the contour circumference of the fourth electrode 212 may be reduced, a facing area of the first electrode 111 and the fourth electrode 212 may be increased, and a facing area of the second electrode 112 and the third electrode 211 may be increased.

Therefore, a facing area between an entire of a first sub-electrode 110 of the first electrode 111 and a first sub-electrode 110 of the second electrode 112 that are electrically connected to the same adjustment connecting unit 32, and an entire of a second sub-electrode 210 of the third electrode 211 and a second sub-electrode 210 of the fourth electrode 212 that are electrically connected to the same adjustment connecting unit 32 are increased, so as to increase the mutual capacitance value of the capacitor unit C where the adjustment connecting unit 32 is located, and improve the linearity of the scribed line on the hole edge region A1 of the touch panel 100.

In some embodiments, a ratio of the area of the first electrode 111 to the area of the second electrode 112 is in a range of 0.8 to 1 inclusive. For example, the ratio is 0.8, 0.9, 1, 1.1 or 1.2.

In some embodiments, a ratio of the area of the third electrode 211 to the area of the fourth electrode 212 is in a range of 0.8 to 1.2, inclusive. For example, the ratio is 0.8, 0.9, 1, 1.1 or 1.2.

In some embodiments, the ratio of the area of the first electrode 111 to the area of the second electrode 112 is in the range of 0.8 to 1.2, inclusive, and the ratio of the area of the third electrode 211 to the area of the fourth electrode 212 is in the range of 0.8 to 1.2, inclusive. For example, the ratio of the area of the first electrode 111 to the area of the second electrode 112 is 0.8, 0.9, 1, 1.1 or 1.2, and the ratio of the area of the third electrode 211 to the area of the fourth electrode 212 is 0.8, 0.9, 1, 1.1 or 1.2.

In some embodiments, a ratio of a sum of the area of the first electrode 111 and the area of the second electrode 112 to a sum of the area of the third electrode 211 and the area of the fourth electrode 212 is in a range of 0.8 to 1.2, inclusive. For example, the ratio is 0.8, 0.9, 1, 1.1 or 1.2.

Figure 16A:
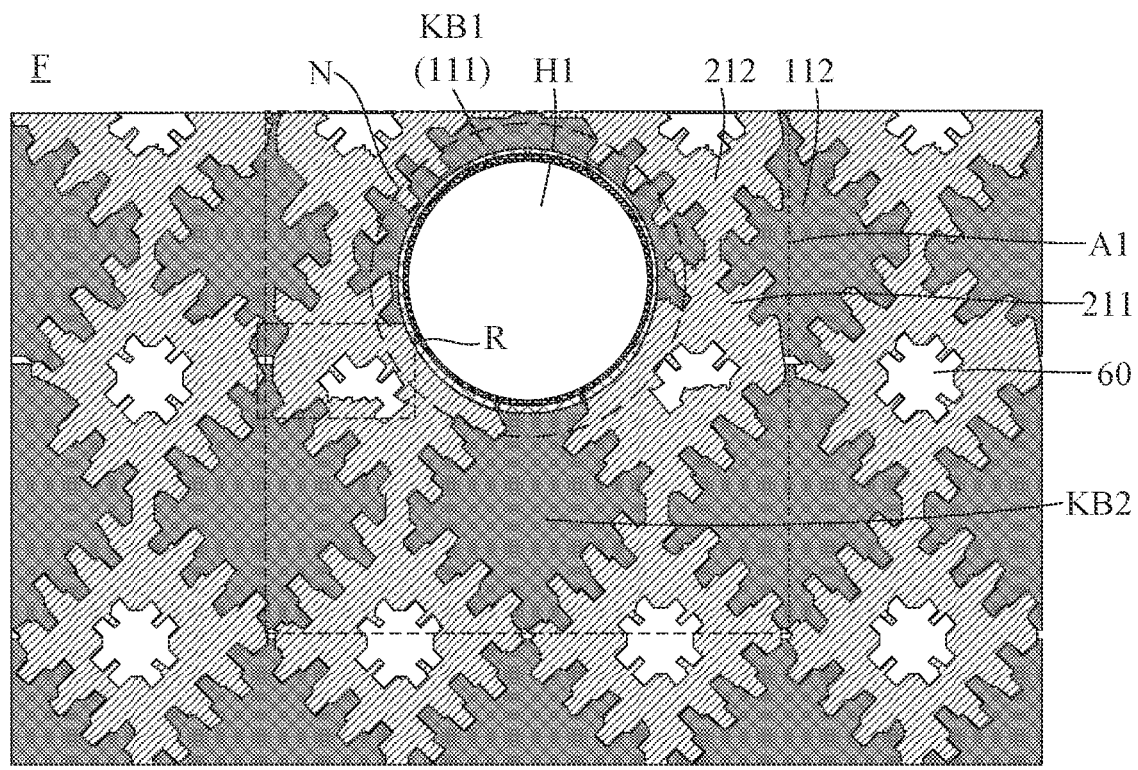
FIG. 16A is a partial enlarged view of the region F in FIG. 3C.

In some embodiments, as shown in FIG. 16A, the contours of the first electrode 111, the second electrode 112, the third electrode 211 and the fourth electrode 212 each have protrusions in various shapes, and the protrusions in various shapes include at least two of a wavy protrusion, a rectangular protrusion, a trapezoidal protrusion and a triangular protrusion.

Through the above arrangement, a protrusion of any one of the first electrode 111, the second electrode 112, the third electrode 211 and the fourth electrode 212 extends into an interior of an electrode adjacent thereto, which may increase a facing area between the adjacent electrodes. Therefore, the mutual capacitance value between the entire of the first electrode 111 and the second electrode 112, and the entire of the third electrode 211 and the fourth electrode 212 may be increased.

Figure 13:
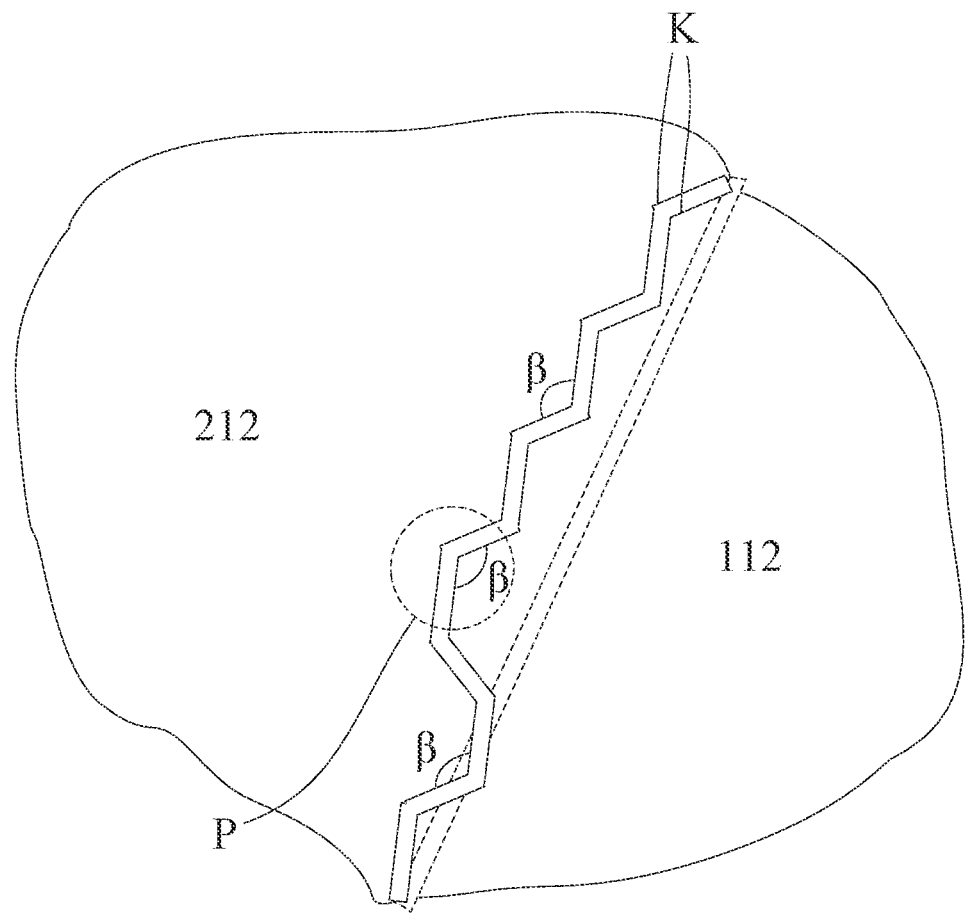
FIG. 13 is a diagram of contours of touch electrodes, in accordance with some embodiments of the present disclosure.

In some embodiments, as shown in FIG. 13, the contours of the first electrode 111, the second electrode 112, the third electrode 211 and the fourth electrode 212 are each formed by a broken line.

Through the above arrangement, the contour circumferences of the first electrode 111, the second electrode 112, the third electrode 211 and the fourth electrode 212 are increased, the facing area between the entire of the first electrode 111 and the second electrode 112, and the entire of the third electrode 211 and the fourth electrode 212 is increased. Therefore, the mutual capacitance value between the entire of the first electrode 111 and the second electrode 112, and the entire of the third electrode 211 and the fourth electrode 212 is increased.

For example, FIG. 13 shows a part of the second electrode 112 and a part of the fourth electrode 212, and borders K thereof. The border K of the second electrode 112 and the border K of the fourth electrode 212 are each formed by a broken line. The border K includes a plurality of broken line segments that are connected end to end. A larger included angle β between any two adjacent broken line segments is an obtuse angle, and the included angle β is in a range of 120° to 140°, inclusive. For example, the included angle β is 120°, 125°, 130°, 135° or 140°.

Compared with the border of the second electrode 112 and the border of the fourth electrode 212 are each formed by a straight line (the dotted lines forming a strip shape shown in FIG. 13 are each a linear border), through the above arrangement of embodiments of the present disclosure, the contour circumference of the second electrode 112 and the contour circumference of the fourth electrode 212 may be increased, and the facing area between the second electrode 112 and the fourth electrode 212 may be increased, thereby increasing the mutual capacitance value between the second electrode 112 and the fourth electrode 212.

Figure 14:
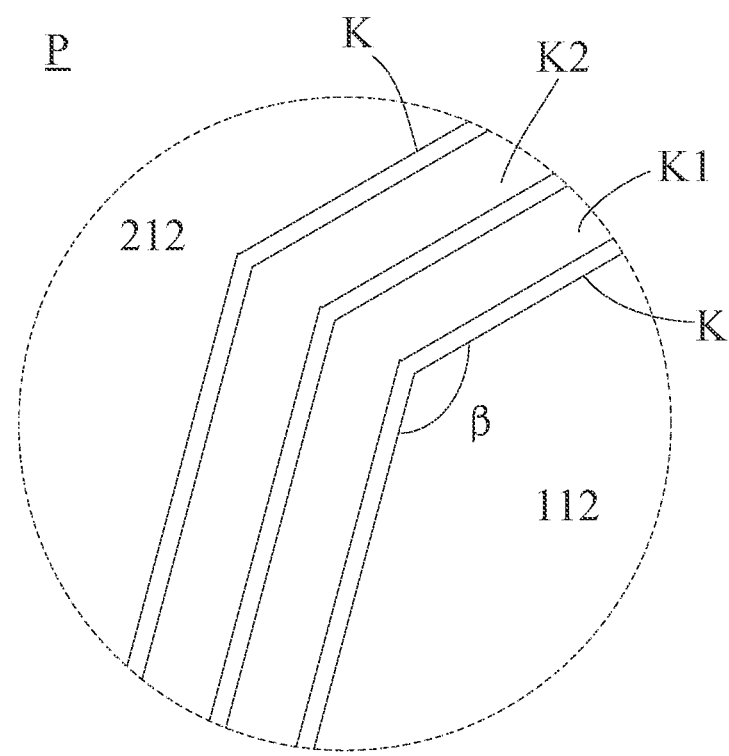
FIG. 14 is a partial enlarged view of the region P in FIG. 13.

In some embodiments, as shown in FIG. 14, a first gap electrode K1 and a second gap electrode K2 are provided at intervals between the border K of the second electrode 112 and the border K of the fourth electrode 212. The first gap electrode K1 and the second gap electrode K2 are in a floating state. That is, the first gap electrode K1 is not electrically connected to the second electrode 112, the fourth electrode 212 and the second gap electrode K2, and the second gap electrode K2 is not electrically connected to the second electrode 112, the four electrodes 212 and the first gap electrode K1.

It will be noted that the first gap electrode K1 and the second gap electrode K2 are both made of a same material and provided in a same layer as the second electrode 112 and the fourth electrode 212. Therefore, by arranging the first gap electrode K1 and the second gap electrode K2 in a gap region between the borders K, it is possible to reduce a difference between light transmittance of the gap region between the borders K and light transmittance of the region where the touch electrodes are disposed, which is beneficial to improve uniformity of light transmittance of each region of the touch substrate 100.

As shown in FIG. 14, the first gap electrode K1 and the second gap electrode K2 are each of a broken line shape, and the first gap electrode K1 and the second gap electrode K2 are substantially parallel to the borders K respectively. The first gap electrode K1 is closer to the second electrode 112 than the second gap electrode K2, and the second gap electrode K2 is closer to the fourth electrode 212 than the first gap electrode K1.

It will be noted that "substantially parallel" means that the first gap electrode K1 and the second gap electrode K2 each include a plurality of broken line segments, each broken line segment of the first gap electrode K1 is parallel to a corresponding broken line segment of the border K, and each broken line segment of the second gap electrode K2 is parallel to a corresponding broken line segment of the border K.

Figure 15:
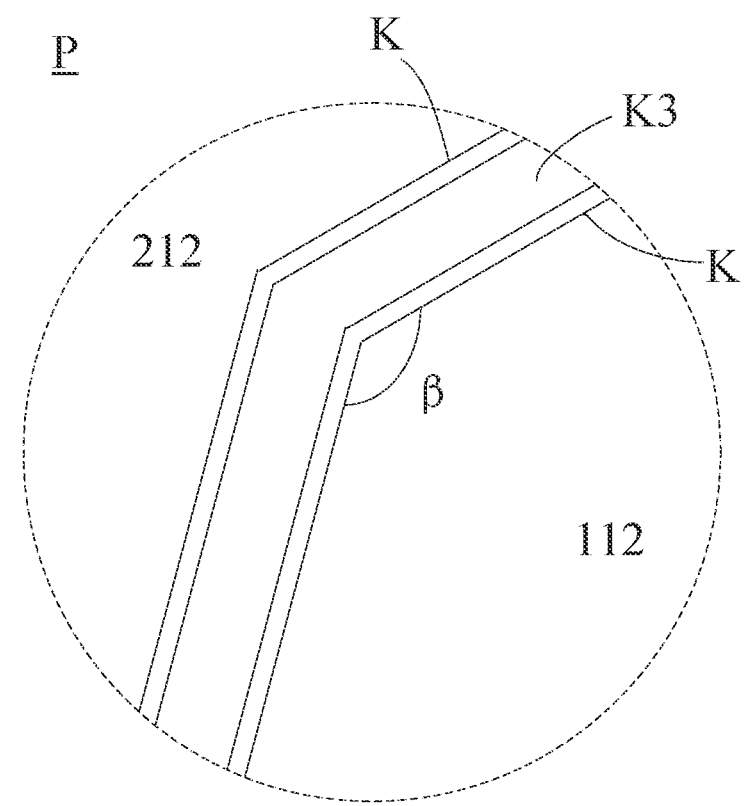
FIG. 15 is a diagram of other contours of touch electrodes, in accordance with some embodiments of the present disclosure.

In some embodiments, as shown in FIG. 15, a third gap electrode K3 is disposed between the border K of the second electrode 112 and the border K of the fourth electrode 212, and the third gap electrode K3 is in a floating state. That is, the third gap electrode K3 is not electrically connected to the second electrode 112 and the fourth electrode 212.

It will be noted that the third gap electrode K3 is made of a same material and provided in a same layer as the second electrode 112 and the fourth electrode 212. Therefore, by arranging the third gap electrode K3 in a gap region between the borders K, it is possible to reduce a difference between light transmittance of the gap region between the borders K and light transmittance of the region where the touch electrodes are disposed, which is beneficial to improve uniformity of light transmittance of each region of the touch substrate 100.

In this way, the area of the second electrode 112 and the area of the fourth electrode 212 may be increased, an area of the gap region between the borders K may be reduced, and the uniformity of the light transmittance of each region of the touch substrate 100 may be further improved.

As shown in FIG. 15, the third gap electrode K3 is of a broken line shape, and the third gap electrode K3 is substantially parallel to the border K.

It will be noted that "substantially parallel" means that the third gap electrode K3 includes a plurality of broken line segments, and each broken line segment of the third gap electrode K3 is parallel to a corresponding broken line segment of the border K.

It will be understood that the arrangement of the above embodiments may be used for a gap region between borders of any two adjacent touch electrodes.

A connecting manner of the touch electrodes is described below.

In some embodiments, as shown in FIGS. 3A and 4, the touch substrate 100 includes an electrode layer 102, an insulating layer (referred to as a first insulating layer hereinafter in order to distinguish it from other subsequent insulating layers) 103 and a bridge layer 104 that are stacked on the substrate 101. The bridge layer 104 is located a side of the electrode layer 102 away from the substrate 101. The first insulating layer 103 is located between the electrode layer 102 and the bridge layer 104, and the first insulating layer 103 is provided with a plurality of via holes 103A therein.

The plurality of first touch electrodes 11, the plurality of second touch electrodes 21 and the plurality of first connecting portions 12 are disposed in the electrode layer 102. That is, the first touch electrodes 11, the second touch electrodes 21 and the first connecting portions 12 are disposed in a same layer. The plurality of second connecting portions 22 are disposed in the bridge layer 104.

In the first direction X, every two adjacent first touch electrodes 11 are directly electrically connected through a first connecting portion 12. In the second direction Y, the second connecting portion 22 is electrically connected to two adjacent second touch electrodes 21 through different via holes 103A.

It will be understood that, in the first direction X, each first connecting portion 12 and the two adjacent first touch electrodes 11 are a one-piece structure, so as to realize electrical connection between the two adjacent first touch electrodes 11.

In the second direction Y, one end of the second connecting portion 22 is electrically connected to one second touch electrode 21 of the two adjacent second touch electrodes 21 through a via hole 103A in the first insulating layer 103; the other end of the second connecting portion 22 is electrically connected to the other second touch electrode 21 of the two adjacent second touch electrodes 21 through another via hole 103A in the first insulating layer 103.

Figure 5:
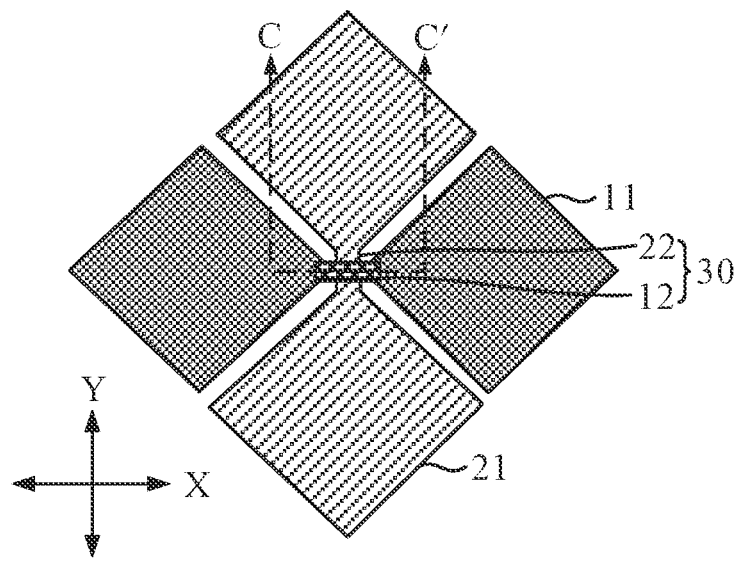
FIG. 5 is a top view of yet another touch substrate, in accordance with some embodiments of the present disclosure.
Figure 6:
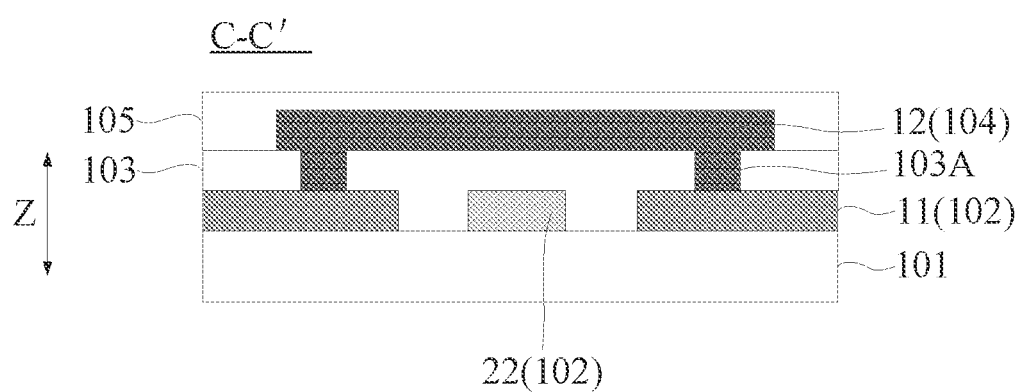
FIG. 6 is a sectional view of the touch substrate in FIG. 5 taken along the line C-C'.

In some embodiments, as shown in FIGS. 5 and 6, the plurality of first touch electrodes 11, the plurality of second touch electrodes 21 and the plurality of second connecting portions 22 are disposed in the electrode layer 102. That is, the first touch control electrodes 11, the second touch electrodes 21 and the second connecting portions 22 are disposed in the same layer. The plurality of first connecting portions 12 are disposed in the bridge layer 104.

In the second direction Y, every two adjacent second touch electrodes 21 are directly electrically connected through a second connecting portion 22. In the first direction X, the first connecting portion 12 is electrically connected to two adjacent first touch electrodes 11 through different via holes 103A.

It will be understood that, in the second direction Y, each second connecting portion 22 and the two adjacent second touch electrodes 21 are a one-piece structure, so as to realize electrical connection between the two adjacent second touch electrodes 21.

In the first direction X, one end of the first connecting portion 12 is electrically connected to one first touch electrode 11 of the two adjacent first touch electrodes 11 through a via hole 103A in the first insulating layer 103; the other end of the first connecting portion 12 is electrically connected to the other one first touch electrode 11 of the two adjacent first touch electrodes 11 through another via hole 103A in the first insulating layer 103.

Figure 7:
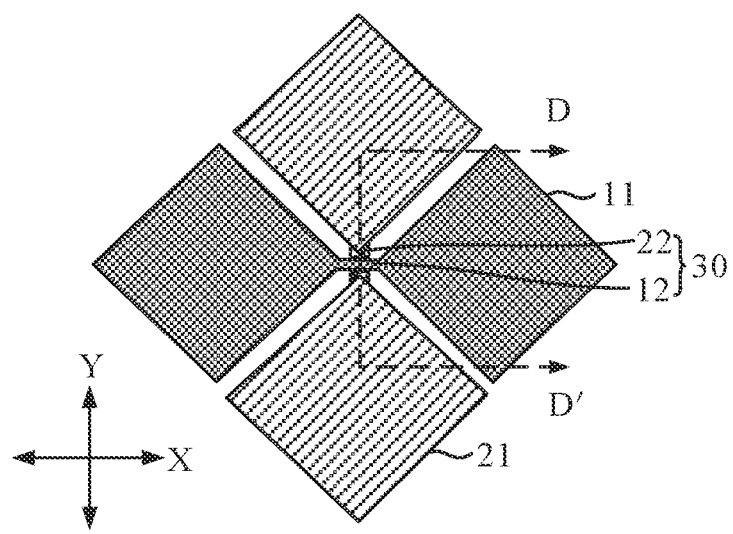
FIG. 7 is a top view of yet another touch substrate, in accordance with some embodiments of the present disclosure.
Figure 8:
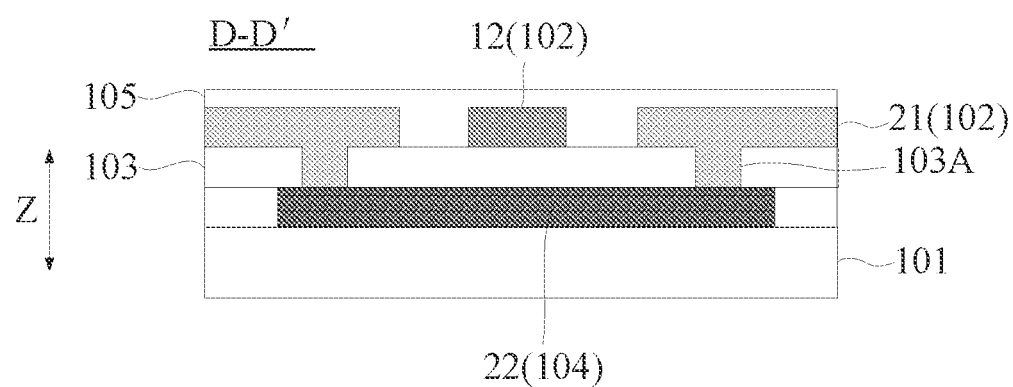
FIG. 8 is a sectional view of the touch substrate in FIG. 7 taken along the line D-D'.

In some other embodiments, as shown in FIGS. 7 and 8, the touch substrate 100 includes an electrode layer 102, a first insulating layer 103 and a bridge layer 104 that are stacked on the substrate 101. The electrode layer 102 is located on a side of the bridge layer 104 away from the substrate 101, the first insulating layer 103 is located between the electrode layer 102 and the bridge layer 104, and the first insulating layer 103 is provided with a plurality of via holes 103A therein.

The plurality of first touch electrodes 11, the plurality of second touch electrodes 21 and the plurality of first connecting portions 12 are disposed in the electrode layer 102. That is, the first touch electrodes 11, the second touch electrodes 21 and the first connecting portions 12 are disposed in the same layer. The plurality of second connecting portions 22 are disposed in the bridge layer 104.

In the first direction X, every two adjacent first touch electrodes 11 are directly electrically connected through a first connecting portion 12. In the second direction Y, two adjacent second touch electrodes 21 are electrically connected to the second connecting portion 22 through different via holes 103A respectively.

It will be understood that, in the first direction X, each first connecting portion 12 and the two adjacent first touch electrodes 11 are a one-piece structure, so as to realize electrical connection between the two adjacent first touch electrodes 11.

In the second direction Y, of the two adjacent second touch electrodes 21, one second touch electrode 21 is electrically connected to one end of the second connecting portion 22 through a via hole 103A in the first insulating layer 103; the other second touch electrode 21 is electrically connected to the other end of the second connecting portion 22 through another via hole 103A in the first insulating layer 103.

Figure 9:
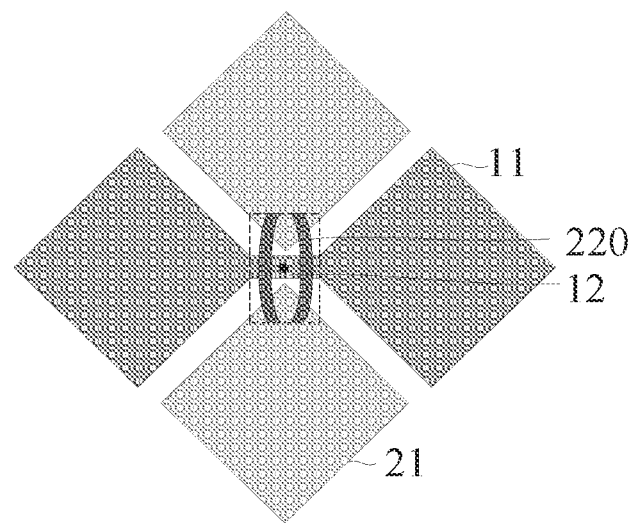
FIG. 9 is a top view of yet another touch substrate, in accordance with some embodiments of the present disclosure.

In some embodiments, as shown in FIG. 9, the plurality of second connecting portions 22 are disposed in the bridge layer 104. The second connecting portion 22 includes at least one second bridge electrode 220. The second bridge electrode 220 is electrically connected to the two adjacent second touch electrodes 21 to realize the electrical connection between the two adjacent second touch electrodes 21.

For example, the second connecting portion 22 includes a plurality of second bridge electrode 220 arranged side by side in the first direction X, and each second bridge electrode 220 extends in the second direction Y. For example, the second connecting portion 22 includes two second bridge electrodes 220 arranged side by side in the first direction X. By arranging the plurality of second bridge electrodes 220, it is possible to increase a contact area between the second bridge electrodes 220 and the second touch electrode 21, so as to increase electrical conductivity between the second touch electrode 21 and the second bridge electrodes 220, and reduce transmission loss of a voltage signal between the second touch electrode 21 and the second bridge electrodes 220.

Figure 10:
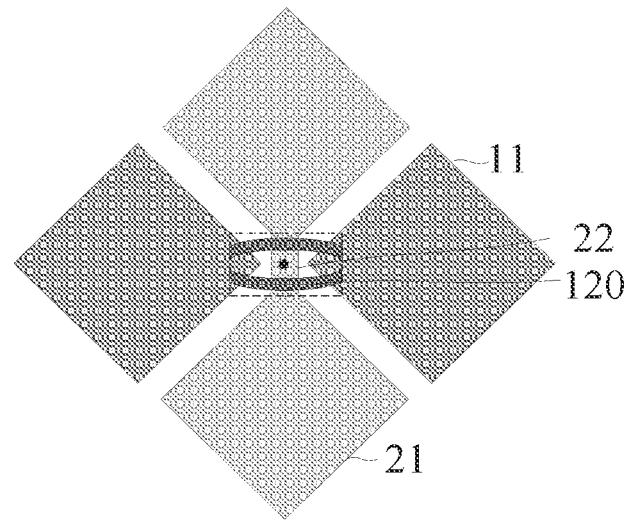
FIG. 10 is a top view of yet another touch substrate, in accordance with some embodiments of the present disclosure.

In some embodiments, as shown in FIG. 10, the plurality of first connecting portions 12 are disposed in the bridge layer 104. The first connecting portion 12 includes at least one first bridge electrode 120. The first bridge electrode 120 is electrically connected to the two adjacent first touch electrodes 11 to realize the electrical connection between the two adjacent first touch electrodes 11.

For example, the first connecting portion 12 includes a plurality of first bridge electrode 120 arranged side by side in the second direction Y, and each first bridge electrode 120 extends in the first direction X. For example, the first connecting portion 12 includes two first bridge electrodes 120 arranged side by side in the second direction Y. By arranging the plurality of first bridge electrodes 120, it is possible to increase a contact area between the first bridge electrodes 120 and the first touch electrode 11, so as to increase electrical conductivity between the first touch electrode 11 and the first bridge electrodes 120, and reduce transmission loss of a voltage signal between the first touch electrode 11 and the first bridge electrodes 120.

Figure 11:
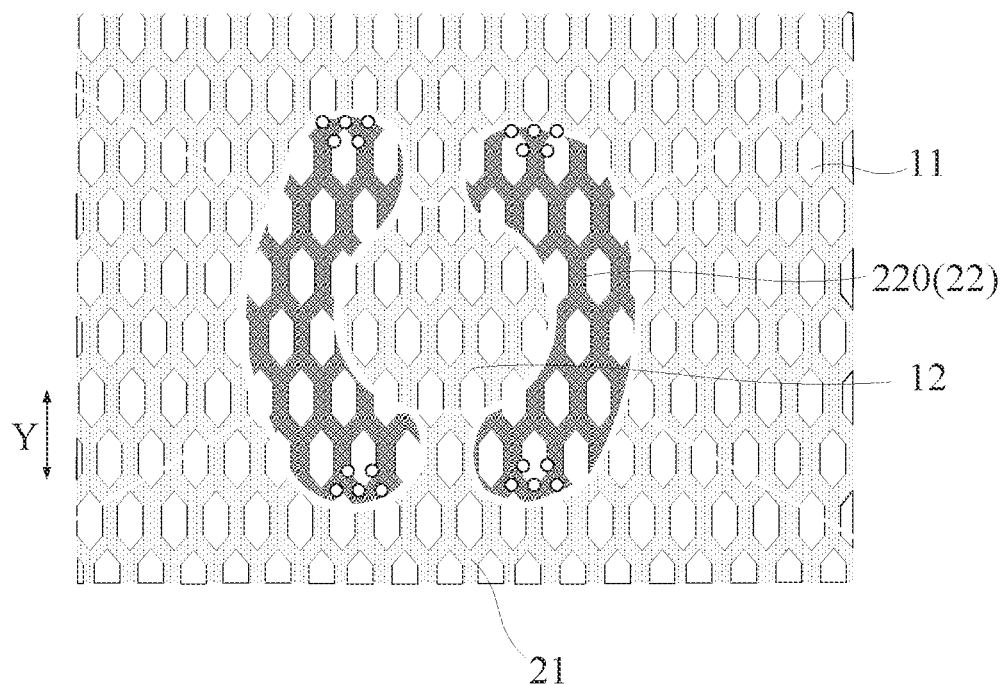
FIG. 11 is a top view of yet another touch substrate, in accordance with some embodiments of the present disclosure.
Figure 12:
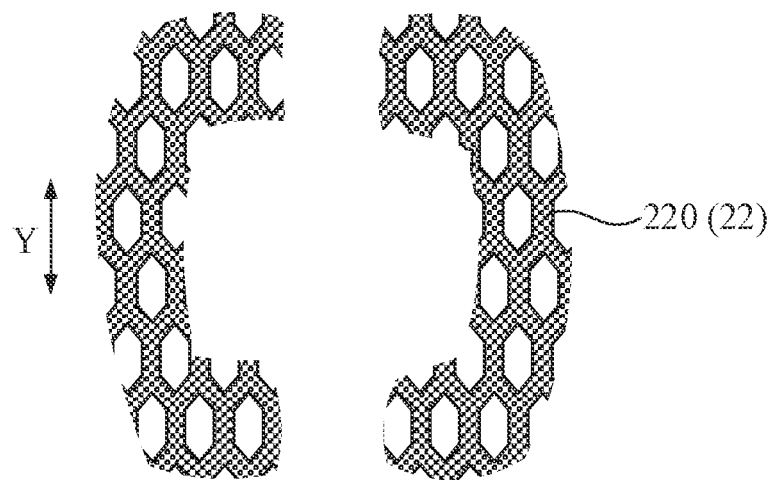
FIG. 12 is a structural diagram of bridge electrodes, in accordance with some embodiments of the present disclosure.

In some embodiments, as shown in FIGS. 11 and 12, the first connecting portion 12 and the second connecting portion 22 each have a metal mesh structure, which may reduce an area of an overlapping part of the first connecting portion 12 and the second connecting portion 22 in a thickness direction Z of the substrate 101. In this way, parasitic capacitance generated between the first connecting portion 12 and the second connecting portion 22 may be reduced, so as to avoid interference between the voltage signal transmitted by the first connecting portion 12 and the voltage signal transmitted by the second connecting portion 22.

Each first bridge electrode 120 extending in the first direction X means that an extending direction of the entire bridge is in the first direction X. In some embodiments, each first bridge electrode 120 may have some parts or structures that are not completely in the first direction X, for example, may have a certain radian or a bent part. It is not limited, as long as the electrical connection between the adjacent first touch electrodes 11 is realized. As shown in FIGS. 11 and 12, each second bridge electrode 220 extending in the second direction Y means that an extending direction of the entire bridge is in the second direction Y. In some embodiments, each second bridge electrode 220 may have some parts or structures that are not completely in the second direction Y, for example, may have a certain radian or a bent part. It is not limited, as long as the electrical connection between the adjacent second touch electrodes 21 is realized.

In some embodiments, an orthogonal projection of the via hole 103A in the first insulating layer 103 on the substrate 101 may be in a shape of a circle, a square or a rectangle.

For example, the orthogonal projection of the via hole 103A in the first insulating layer 103 on the substrate 101 is in the shape of the circle, and a diameter of the circle is in a range of 20 μm to 40 μm, inclusive. For example, the diameter of the circle is 20 μm, 25 μm, 30 μm, 36 μm or 40 μm.

For example, the orthogonal projection of the via hole 103A in the first insulating layer 103 on the substrate 101 is in the shape of the square, and a side length of the square is in a range of 20 μm to 40 μm, inclusive. For example, the side length of the square is 20 μm, 25 μm, 30 μm, 36 μm or 40 μm.

In some embodiments, as shown in FIGS. 4 and 6, the touch substrate 100 further includes a second insulating layer 105 disposed on a side of the bridge layer 104 away from the substrate 101, and the second insulating layer 105 is used to protect the bridge layer 104.

In some embodiments, orthogonal projections of the first connecting portion 12 and/or the second connecting portion 22 on the substrate 101 may be a rectilinear figure, a polygonal figure or a curvilinear figure.

For example, as shown in FIG. 5, the orthogonal projection of the first connecting portion 12 on the substrate 101 is the rectilinear figure, and the orthogonal projection of the second connecting portion 22 on the substrate 101 is the rectilinear figure.

For example, as shown in FIG. 7, the orthogonal projection of the first connecting portion 12 on the substrate 101 is the rectilinear figure, and the orthogonal projection of the second connecting portion 22 on the substrate 101 is the rectilinear figure.

For example, as shown in FIG. 9, the orthogonal projection of the first connecting portion 12 on the substrate 101 is the rectilinear figure, and the orthogonal projection of the second connecting portion 22 on the substrate 101 is the curvilinear figure. That is, the second connecting portion 22 includes the two second bridge electrodes 220, orthogonal projections of the second bridge electrodes 220 on the substrate 101 are each a curvilinear figure, and arc tops of the two curvilinear figures are arranged opposite to each other.

In some embodiments, as shown in FIGS. 3A and 7, a dimension of the connecting unit 30 in the second direction Y is greater than or equal to a dimension of the connecting unit 30 in the first direction X.

For example, the dimension of the connecting unit 30 in the second direction Y is in a range of 0.5 mm to 0.7 mm, inclusive. For example, the dimension of the connecting unit 30 in the second direction Y is 0.5 mm, 0.55 mm, 0.6 mm, 0.65 mm or 0.7 mm.

Moreover, the dimension of the connecting unit 30 in the first direction X is in a range of 0.45 mm to 0.65 mm, inclusive. For example, the dimension of the connecting unit 30 in the first direction X is 0.45 mm, 0.5 mm, 0.55 mm, 0.6 mm or 0.65 mm.

In some embodiments, as shown in FIG. 5, the dimension of the connecting unit 30 in the first direction X is greater than or equal to the dimension in the second direction Y.

For example, the dimension of the connecting unit 30 in the first direction X is in a range of 0.5 mm to 0.7 mm, inclusive. For example, the dimension of the connecting unit 30 in the first direction X is 0.5 mm, 0.56 mm, 0.6 mm, 0.64 mm or 0.7 mm.

Moreover, the dimension of the connecting unit 30 in the second direction Y is in a range of 0.45 mm to 0.65 mm, inclusive. For example, the dimension of the connecting unit 30 in the second direction Y is 0.45 mm, 0.52 mm, 0.55 mm, 0.58 mm or 0.65 mm.

In addition, in the related art, as shown in FIG. 21, a corner of the display panel has a curved shape, which will destroy integrity of touch electrodes in a region corresponding to the corner of the touch substrate 100'. A contour circumference of the touch electrode located in the corner region of the touch substrate 100' is less than a contour circumference of the touch electrode in the normal region, so that a facing area of touch electrodes located in the corner region is less than a facing area of touch electrodes in the normal region. Therefore, there is a large difference between mutual capacitance values generated after the touch electrodes located in the corner region and the touch electrodes located in the normal region are touched. When a finger scribes a line on the touch substrate 100' and passes through the corner region, since mutual capacitance values of the touch electrodes in the corner region are small, the scribed line may vibrate, for example, may curve and even break, on the corner region. As a result, linearity of the scribed line on the touch substrate 100' is poor.

In order to solve the above problem, in some embodiments, as shown in FIG. 3A, the main touch region A2 includes a corner region A3, and at least one connecting unit 30 located in the corner region A3 is a corner connecting unit 37.

In a first touch unit 10 corresponding to the corner connecting unit 37, a straight line where a line connecting centers of at least two first touch electrodes 11 in the main touch region A2 is located is a third reference line L3. In a second touch unit 20 corresponding to the corner connecting unit 37, a straight line where a line connecting centers of at least two second touch electrodes 21 in the main touch region A2 is located is a fourth reference line L4. An intersection point of the third reference line L3 and the fourth reference line L4 is a corner reference point P5. In the direction parallel to the plane of the substrate 101, the corner reference point P5 is farther from the center D of the mounting hole H1 than a center D5 of the corner connecting unit 37.

It will be understood that the corner region A3 of the main touch region A2 corresponds to the corner region of the touch substrate 100. In the direction parallel to the plane of the substrate 101, a distance between the center of the corner connecting unit 37 and the center D of the mounting hole H1 is less than a distance between the corner reference point P5 corresponding to the corner connecting unit 37 and the center D of the mounting hole H1.

Moreover, the center of the "corner connecting unit 37" does not overlap with the corresponding corner reference point P5, in conjunction with FIGS. 3A and 21, which may be understood as adjusting a position of the connecting unit 30 in the corner region A3, so that the connecting unit 30 is closer to the mounting hole H1 than the corresponding corner reference point P5. The connecting unit 30 whose position is adjusted is the "corner connecting unit 37". The "center of the corner connecting unit 37" refers to a center of orthogonal projection of the corner connecting unit 37 on the substrate 101.

It will be noted that since the position of the corner connecting unit 37 is adjusted relative to the position of the corresponding corner reference point P5, shapes of contours of touch electrodes electrically connected to the corner connecting unit 37 are changed, which are different from the shape of the contour of the touch electrode located in the main touch region A2 other than the corner region A3.

In the touch substrate 100 of the above embodiments of the present disclosure, the corner reference point P5 is disposed farther from the center D of the mounting hole H1 than the center of the corner connecting unit 37. In this way, of the two first touch electrodes 11 electrically connected to the corner connecting unit 37, a contour circumference of a first touch electrode 11 farther away from the mounting hole H1 is increased; and of the two second touch electrodes 21 electrically connected to the corner connecting unit 37, a contour circumference of a second touch electrode 21 farther away from the mounting hole H1 is increased. Therefore, a facing area of a first sub-electrode 110 and a second sub-electrode 210 in a capacitor unit C where the corner connecting unit 37 is located is increased.

By increasing the facing area of the first sub-electrode 110 and the second sub-electrode 210 in the capacitor unit C where the corner connecting unit 37 is located, it is possible to reduce a difference between the facing area of the first sub-electrode 110 and the second sub-electrode 210 in the capacitor unit C where the corner connecting unit 37 is located and the facing area of the first sub-electrode 110 and the second sub-electrode 210 in the capacitor unit C in the main touch region A2, and reduce a difference between a mutual capacitance value of the capacitor unit C where the corner connecting unit 37 is located and the mutual capacitance value of the capacitor unit C in the main touch region A2. As a result, the linearity of the scribed line on the corner region A3 of the touch substrate 100 may be improved, and the touch precision on the corner region A3 of the touch substrate 100 may be improved.

Figure 18:
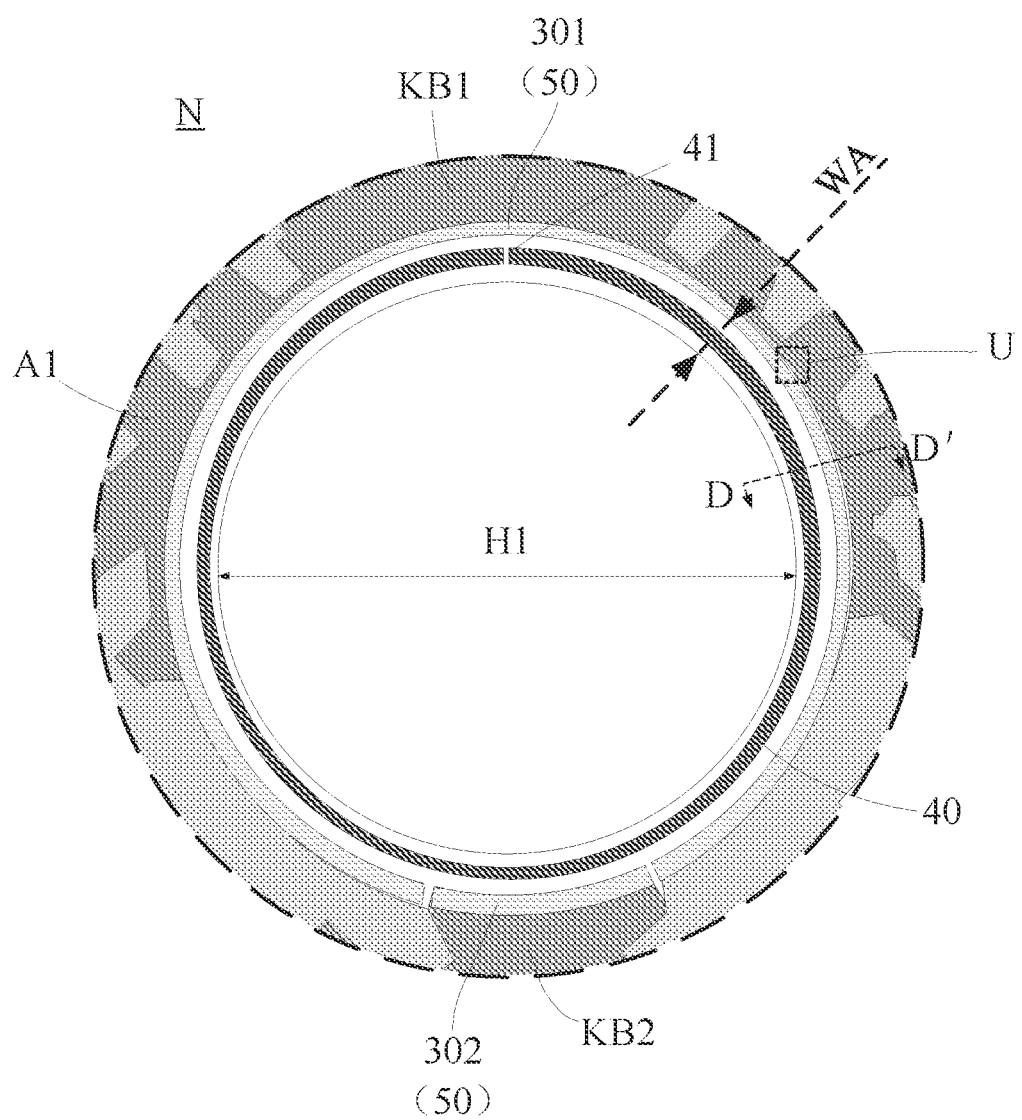
FIG. 18 is a partial enlarged view of the region N in FIG. 16A.

In some embodiments, as shown in FIG. 18, in the first touch unit 10 and the second touch unit 20 that pass through the mounting hole H1, each touch electrode around the mounting hole H1 is a hole edge electrode (e.g., the first hole edge electrode KB1 and the second hole edge electrode KB2 in FIG. 18).

The touch substrate 100 further includes a connecting ring 50 disposed around the mounting hole H1. The connecting ring 50 includes at least two connecting segments (e.g., the first connecting segment 301 and the second connecting segment 302 in FIG. 18) arranged at intervals. Each connecting segment is electrically connected to one hole edge electrode.

The connecting segment is connected to the hole edge electrode in parallel, so that impedance of the hole edge electrode may be reduced, and thus a voltage drop of a voltage signal transmitted by the hole edge electrode may be reduced.

In some embodiments, as shown in FIG. 18, the touch substrate 100 includes the first hole edge electrode KB1 and the second hole edge electrode KB2, and the connecting ring 50 includes the first connecting segment 301 and the second connecting segment 302. The first connecting segment 301 is electrically connected to the first hole edge electrode KB1, and the second connecting segment 302 is electrically connected to the second hole edge electrode KB2.

The first connecting segment 301 is connected to the first hole edge electrode KB1 in parallel, and the second connecting segment 302 is connected to the second hole edge electrode KB2 in parallel, so that impedance of the first hole edge electrode KB1 and the second hole edge electrode KB2 may be reduced, and thus a voltage drop of a voltage signal transmitted by the first hole edge electrode KB1 and the second hole edge electrode KB2 may be reduced.

It will be understood that, as shown in FIG. 18, since an area of the first hole edge electrode KB1 is greater than an area of the second hole edge electrode KB2, a length of the first connecting segment 301 is set to be greater than a length of the second connecting segment 302. As a result, an area compensation for the first hole edge electrode KB1 is greater than an area compensation for the second hole edge electrode KB2, and thus a difference between the area of the first hole edge electrode KB1 and the area of the second hole edge electrode KB2 may be reduced. It is beneficial to improve the linearity of the scribed line around the mounting hole H1 on the touch substrate 100, and improve the touch precision of the periphery of the mounting hole H1 of the touch substrate 100.

Figure 19:
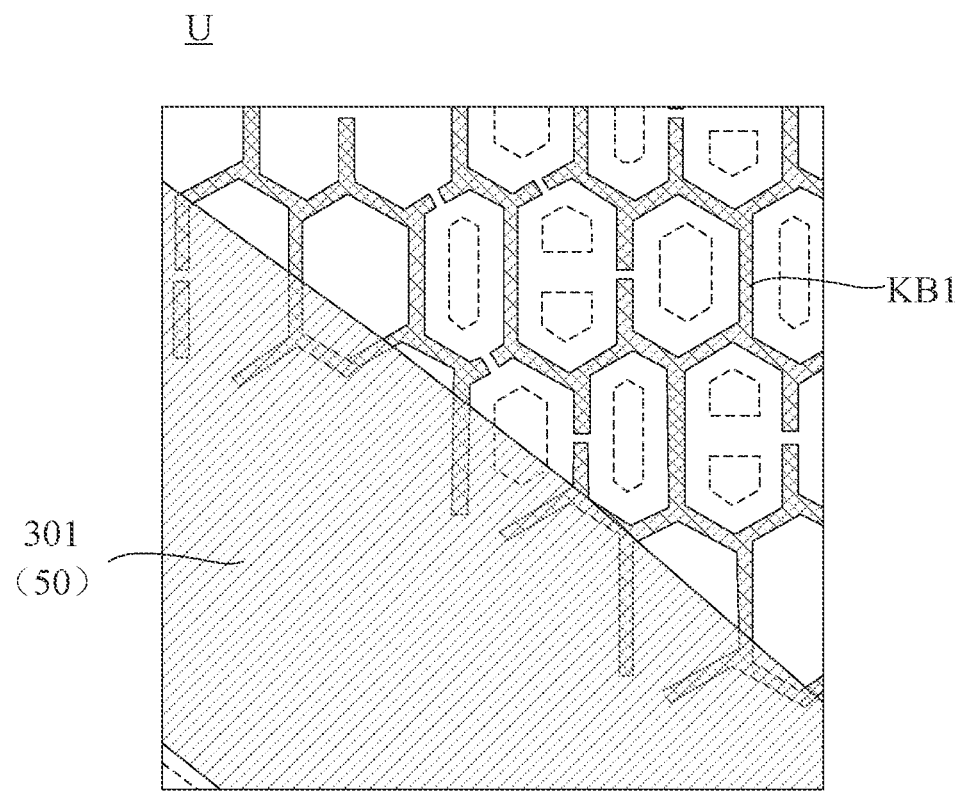
FIG. 19 is a partial enlarged view of the region U in FIG. 18.
Figure 20:
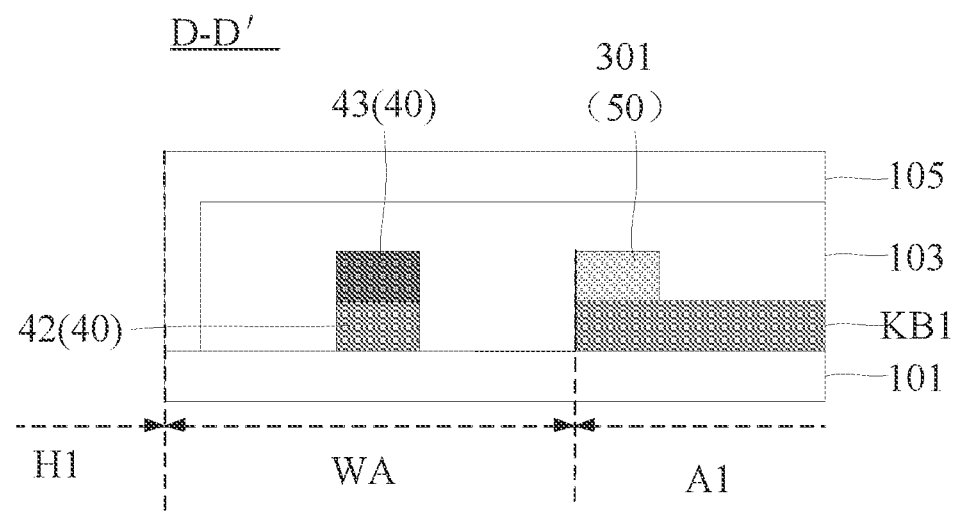
FIG. 20 is a sectional view of the touch substrate in FIG. 18 taken along the line D-D'.

For example, as shown in FIGS. 19 and 20, the first connecting segment 301 is in direct electrical contact with the first hole edge electrode KB1. For example, the first connecting segment 301 is located on a surface of the first hole edge electrode KB1 away from the substrate 101, and the first connecting segment 301 is in direct electrical contact with the first hole edge electrode KB1.

It will be noted that, as shown in FIG. 19, in a case where the touch electrode (the first hole edge electrode KB1 in FIG. 17) has the metal mesh structure, in a process of preparing the connecting ring 50, the connecting ring 50 covers the touch electrode, and a part of the connecting ring 50 is located in mesh holes of the touch electrode.

For example, the second connecting segment 302 is in direct electrical contact with the second hole edge electrode KB2. For example, the connecting manner of the first connecting segment 301 and the first hole edge electrode KB1 is applicable to the two.

For example, the connecting ring 50 may be made of a metal conductive material, which is directly dutted to the first hole edge electrode KB1 and the second hole edge electrode KB2.

In some embodiments, as shown in FIG. 18, the touch substrate 100 further includes a wiring region WA around the mounting hole H1, and the wiring region WA is located between the mounting hole H1 and the hole edge region A1. The touch substrate 100 further includes a light blocking ring 40 disposed in the wiring region WA. The light blocking ring 40 has at least one opening 41, and the light blocking ring 40 is unconnected at the opening 41.

In a case where the touch substrate 100 and the display substrate are integrated, the region around the mounting hole H1 is a region where image display is required, and the light blocking ring 40 may prevent light passing through the mounting hole H1 from entering the region around the mounting hole H1, so that the light may be prevent form entering the display region and affecting the display quality.

In addition, the opening 41 of the light blocking ring 40 may be used to release static electricity generated in the light blocking ring 40 to the outside of the touch substrate 100, so as to prevent the static electricity from entering the main touch region A2 and affecting the touch effect.

In some embodiments, as shown in FIG. 20, the light blocking ring 40 at least includes a first light blocking layer 42 and a second light blocking layer 43 that are stacked on the substrate 101 in sequence. The first light blocking layer 42 is made of a same material and disposed in a same layer as the first touch electrode 11 and the second touch electrode 21, and the second light blocking layer 43 is made of a same material and disposed in the same layer as the connecting ring 50.

It will be understood that a film layer for forming specific patterns is formed through a single film forming process, and then the first touch electrode 11, the second touch electrode 21 and the first light blocking layer 42 of the light blocking ring 40 are formed by performing a single patterning process on the film layer using a same mask. Moreover, another film layer for forming specific patterns is formed through a single film forming process, and then the connecting ring 50 and the second light blocking layer 43 of the light blocking ring 40 is formed by performing a single patterning process on the film layer using a same mask.

In some embodiments, a dimension of the touch substrate 100 in the second direction Y is greater than a dimension of the touch substrate in the first direction X, so that a dimension of the second touch unit 20 in the second direction Y is greater than a dimension of the first touch unit 10 in the first direction X. In this case, as shown in FIG. 16A, the second touch electrode 21 is provided therein with a dummy electrode (i.e., an opening) 60 disconnected from the second touch electrode 21, and the dummy electrode 60 is insulated from the second touch electrode 21.

It will be understood that the dummy electrode 60 does not transmit a voltage signal, so that an area of an electrode for transmitting the voltage signal in the second touch electrode 21 is reduced. A difference between the area of the electrode for transmitting the signal in the first touch electrode 11 and the area of the electrode for transmitting the signal in the second touch electrode 21 is reduced, so that the problem that the mutual capacitance values of different touch units are affected by the difference between the areas of the touch electrodes may be alleviated, and accuracy of sensing the touch position may be improved.

For example, the first touch electrode 11 may be a touch sensing electrode, and the second touch electrode 21 may be a touch driving electrode.

In some embodiments, the dimension of the touch substrate 100 in the first direction X is greater than the dimension of the touch substrate 100 in the second direction Y, so that the dimension of the first touch unit 10 in the first direction X is greater than the dimension of the second touch unit 20 in the second direction Y.

The first touch electrode 11 is provided therein with another dummy electrode (i.e., another opening) 60 disconnected from the first touch electrode 11, and the dummy electrode 60 is insulated from the first touch electrode 11. Therefore, the dummy electrode 60 does not transmit a voltage signal. In this way, an area of an electrode for transmitting the voltage signal in the first touch electrode 11 is reduced. A difference between the area of the electrode for transmitting the signal in the first touch electrode 11 and the area of the electrode for transmitting the signal in the second touch electrode 21 is reduced, so that the problem that the mutual capacitance values of different touch units are affected by the difference between the areas of the touch electrodes may be alleviated, and the accuracy of sensing the touch position may be improved.

For example, the first touch electrode 11 may be a touch driving electrode, and the second touch electrode 21 may be a touch sensing electrode.

In some embodiments, as shown in FIG. 16A, a shape of the dummy electrode 60 located in the hole edge region A1 is different from a shape of the dummy electrode 60 located in the main touch region A2.

It will be understood that the shape of the contour the touch electrode located in the hole edge region A1 is different from the shape of the contour of the touch electrode located in the main touch region A2. In order to adapt to the shape of the contour of the touch electrode located in the hole edge region A1, a shape of the dummy electrode 60 in the touch electrode in the hole edge region A1 is adjusted accordingly.

Figure 16B:
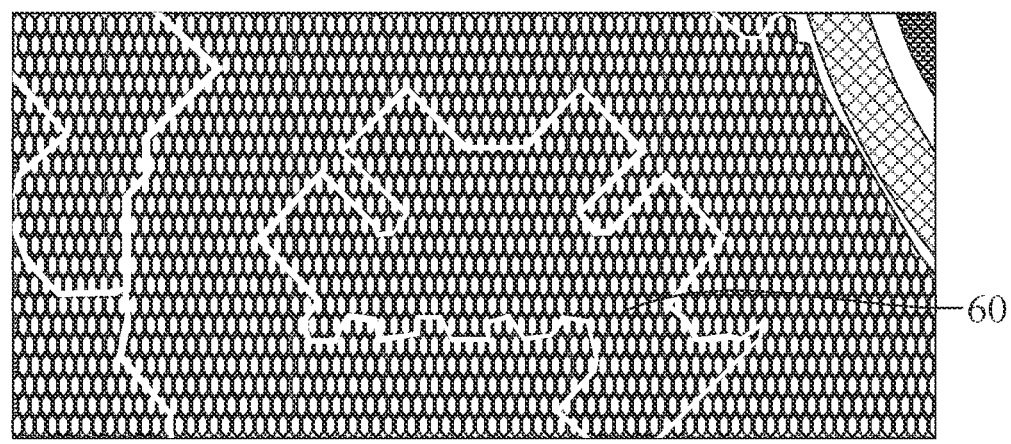
FIG. 16B is a partial enlarged view of the region R in FIG. 16A.

For example, as shown in FIG. 16B, the dummy electrode 60 located in the hole edge region A1 has protrusions in various shapes, and the protrusions in various shapes include a wavy protrusion, a rectangular protrusion, a spherical protrusion, a triangular protrusion and a jagged protrusion.

Figure 17:
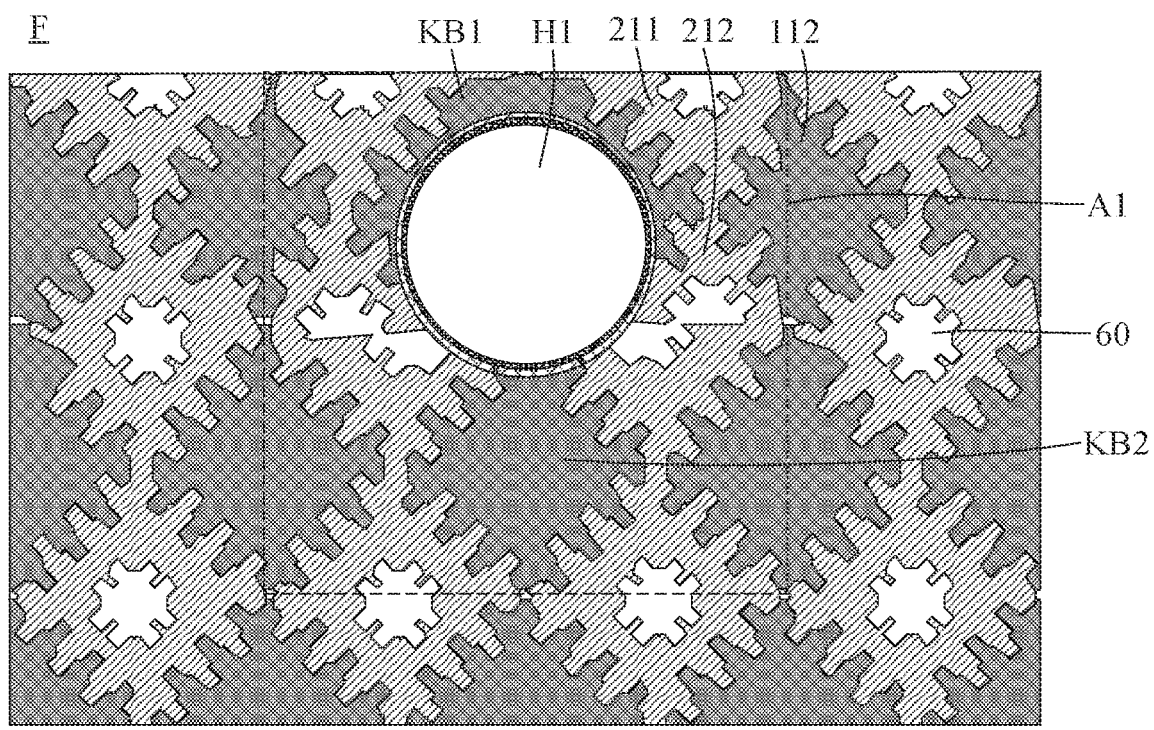
FIG. 17 is a top view of yet another touch substrate, in accordance with some embodiments of the present disclosure.

In some embodiments, as shown in FIG. 16A, the dummy electrode 60 located in the hole edge region A1 is disposed inside the first touch electrode 11. That is, the dummy electrode 60 is embedded inside the first touch electrode 11, and the outer contour of the first touch electrode 11 is closed. In some other embodiments, as shown in FIG. 17, the dummy electrode 60 located in the hole edge region A1 may pass through the outer contour of the first touch electrode 11. That is, the outer contour of the first touch electrode 11 is not closed and has a notch.

In some embodiments, the first touch electrode 11 and the second touch electrode 21 may be each a whole layer of electrode. For example, the material of the first touch electrode 11 and the second touch electrode 21 may include indium tin oxide (ITO) or indium zinc oxide (IZO).

In some embodiments, as shown in FIG. 19, a first touch electrode and a second touch electrode each have a metal mesh structure. The touch electrodes of the metal mesh structure have low resistance and high sensitivity, which may improve the touch sensitivity of the touch substrate 100. Moreover, the touch electrodes of the metal mesh structure have high mechanical strength, which may reduce a weight of the touch substrate 100, and thus reduce a weight of a display device to which the touch substrate 100 is applied.

In some embodiments, a line width of a metal mesh of the touch electrode located in the hole edge region A1 is greater than a line width of a metal mesh of the touch electrode located in the main touch region A2, so that electrode areas of the first touch electrode 11 and the second touch electrode 21 in the hole edge region A1 may be compensated. The areas of the first touch electrode 11 and the second touch electrode 21 in the hole edge region A1 are increased, so that the mutual capacitance value between the first touch electrode 11 and the second touch electrode 21 is increased, and the problem of poor linearity of the scribed line on the hole edge region A1 of the touch panel 100 may be further ameliorated.

For example, the line width of the metal mesh of the touch electrode located in the hole edge region A1 is in a range of 4 μm to 4.8 μm, inclusive, for example, the line width is 4 μm, 4.2 μm, 4.4 μm, 4.5 μm or 4.8 μm. The line width of the metal mesh of the touch electrode located in the main touch region A2 is in a range of 3.8 μm to 4.2 μm, inclusive, for example, the line width is 3.8 μm, 3.9 μm, 4 μm, 4.1 μm or 4.2 μm.

The display panel 300 provided by some embodiments of the present disclosure is described by taking an example in which the display substrate 200 is an organic light-emitting diode (OLED) display substrate.

The display substrate 200 includes a substrate, and a driving circuit layer and light-emitting devices that are stacked on the substrate.

For example, the substrate may be a flexible substrate, which may improve the flexibility of the display substrate 200 and make the display substrate 200 have bendable and foldable performance, and so on, so as to expand an applicable scope of the display substrate 200.

For example, the display substrate 200 may be a rigid substrate, and the performance of the substrate may be determined according to actual requirements of the product.

Figure 22:
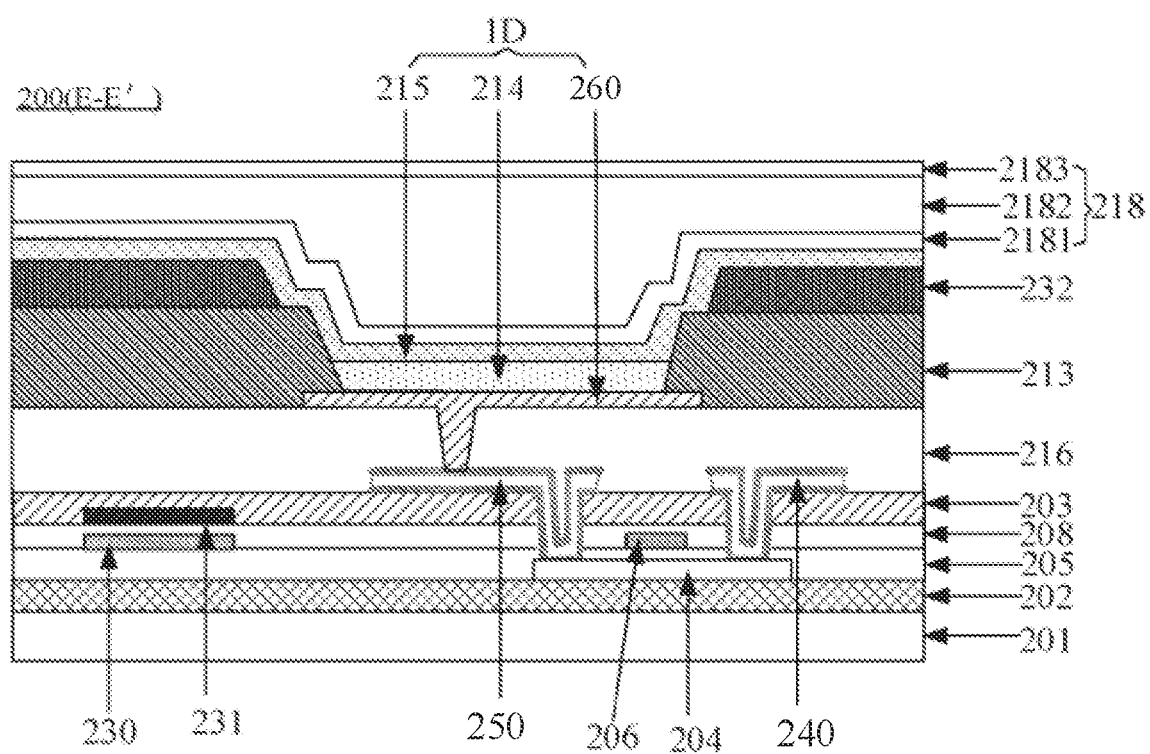
FIG. 22 is a structural diagram of a display substrate, in accordance with some embodiments of the present disclosure.

The substrate may have a single-layer structure or a multi-layer structure. For example, as shown in FIG. 22, the substrate may include a polyimide layer 201 and a buffer layer 202 that are stacked in sequence. For another example, in some other embodiments, the substrate may include a plurality of polyimide layers 201 and a plurality of buffer layers 202 that are alternately stacked in sequence.

For example, a material of the buffer layer 202 may include silicon nitride and/or silicon oxide to realize an effect of blocking water, oxygen and alkaline ions.

In some embodiments, the driving circuit layer includes thin film transistors and capacitor structures. As shown in FIG. 22, a type of the thin film transistor may be a top-gate type, and the thin film transistor may include an active layer 204, a portion of a first gate insulating layer 205, a gate 206, a portion of a second gate insulating layer 208, an interlayer dielectric layer 203, a source 240 and a drain 250.

For example, the active layer 204 may be disposed on the buffer layer 202, the first gate insulating layer 205 covers the buffer layer 202 and the active layer 204, the gate 206 is disposed on a side of the first gate insulating layer 205 away from the substrate, and the second gate insulating layer 208 covers the gate 206 and the first gate insulating layer 205, the interlayer dielectric layer 203 covers the second gate insulating layer 208, the source 240 and the drain 250 are formed on a side of the interlayer dielectric layer 203 away from the substrate, the source 240 and the drain 250 may be electrically connected to the active layer 204 through via holes in the interlayer dielectric layer 203.

For example, the interlayer dielectric layer 203 is made of an inorganic material, such as silicon oxide or silicon nitride, so as to realize the effect of blocking water, oxygen and alkaline ions.

As shown in FIG. 22, the capacitor structure includes a first electrode plate 230 and a second electrode plate 231. The first electrode plate 230 is disposed in a same layer as the gate 206, and the second electrode plate 231 is located between the second gate insulating layer 208 and the interlayer dielectric layer 203, and is disposed opposite to the first electrode plate 230.

For example, materials of the gate 206, the first electrode plate 230 and the second electrode plate 231 may each include a metal material or an alloy material, such as molybdenum, aluminum and titanium.

For example, materials of the source 240 and the drain 250 may each include a metal material or an alloy material, for example, may have a metal single-layer or multi-layer structure formed by molybdenum, aluminum and titanium. The multi-layer structure is a metal stack, such as three-layer metal stack including titanium, aluminum and titanium (Al/Ti/Al).

In some embodiments, as shown in FIG. 22, the display substrate 200 further includes a pixel defining portion 213 disposed on the driving circuit layer. The light-emitting device includes a first electrode 260, a light-emitting portion 214 and a second electrode 215, which are sequentially formed on the interlayer dielectric layer 203.

For example, in a case where the type of the thin film transistor is a top-gate type, a planarization layer 216 may be formed before the light-emitting device is formed. The planarization layer 216 may have a single-layer structure or a multi-layer structure. The planarization layer 216 is usually made of an organic material, such as photoresist, acrylic-based polymer, silicon-based polymer. As shown in FIG. 22, the planarization layer 216 is formed between the interlayer dielectric layer 203 and the first electrode 260.

The first electrode 260 may be electrically connected to the drain 250 through a via hole in the planarization layer 216, that is, the first electrode 260 is an anode. A material of the anode may include indium tin oxide, indium zinc oxide or zinc oxide.

The pixel defining portion 213 may cover the planarization layer 216, and the pixel defining portion 213 may be made of an organic material, such as photoresist. The pixel defining portion 213 has a plurality of openings, and each opening exposes at least part of the first electrode 260.

The light-emitting portion 214 is located in the opening of the pixel defining portion 213 and is formed on the first electrode 260. The light-emitting portion 214 may include a small molecular organic material or a polymer molecular organic material, and may be a fluorescent light-emitting material or a phosphorescent light-emitting material that may emit red light, green light, blue light, white light, or the like. Moreover, according to different actual needs, in different examples, the light-emitting portion 214 may further include light-emitting functional layers such as an electron injection layer, an electron transport layer, a hole injection layer and a hole transport layer. The second electrode 215 covers the light emitting part 214, and a polarity of the second electrode 215 is opposite to a polarity of the first electrode 260. The second electrode 215 may be a cathode, and a material of the cathode may include lithium (Li), aluminum (Al), magnesium (Mg), silver (Ag) or the like.

It will be noted that, as shown in FIG. 22, the first electrode 260, the light-emitting portion 214 and the second electrode 215 may constitute a light-emitting sub-pixel 1D. The light-emitting devices may include a plurality of light-emitting sub-pixels 1D arranged in an array. In addition, it will be noted that first electrodes 260 of respective light-emitting sub-pixels 1D are separate from each other, and second electrodes 215 of the respective light-emitting sub-pixels 10 are connected to each other. That is, the second electrodes 215 form a whole layer of electrode disposed on the display substrate 200 and serves as a common electrode of the plurality of light-emitting devices.

In some embodiments, as shown in FIG. 22, a support portion 232 is provided on a side of the pixel defining portion 213 away from the substrate, and the support portion 232 may play a role of supporting a protective film layer to prevent the protective film layer from contacting the first electrode 260 or other wirings, resulting in the first electrode 260 or other wirings to break.

It will be noted that the protective film layer mainly appears in a process of transferring a semi-manufactured product to avoid damage to the semi-manufactured product in the transferring process. For example, in a process of transferring the substrate on which the support portion 232 is formed to an evaporation line, the protective film layer may be covered, and the protective film layer may be removed when the luminescent material needs to be evaporated.

For example, the support portion 232 may be made of the same material as the pixel defining portion 213.

Figure 23:
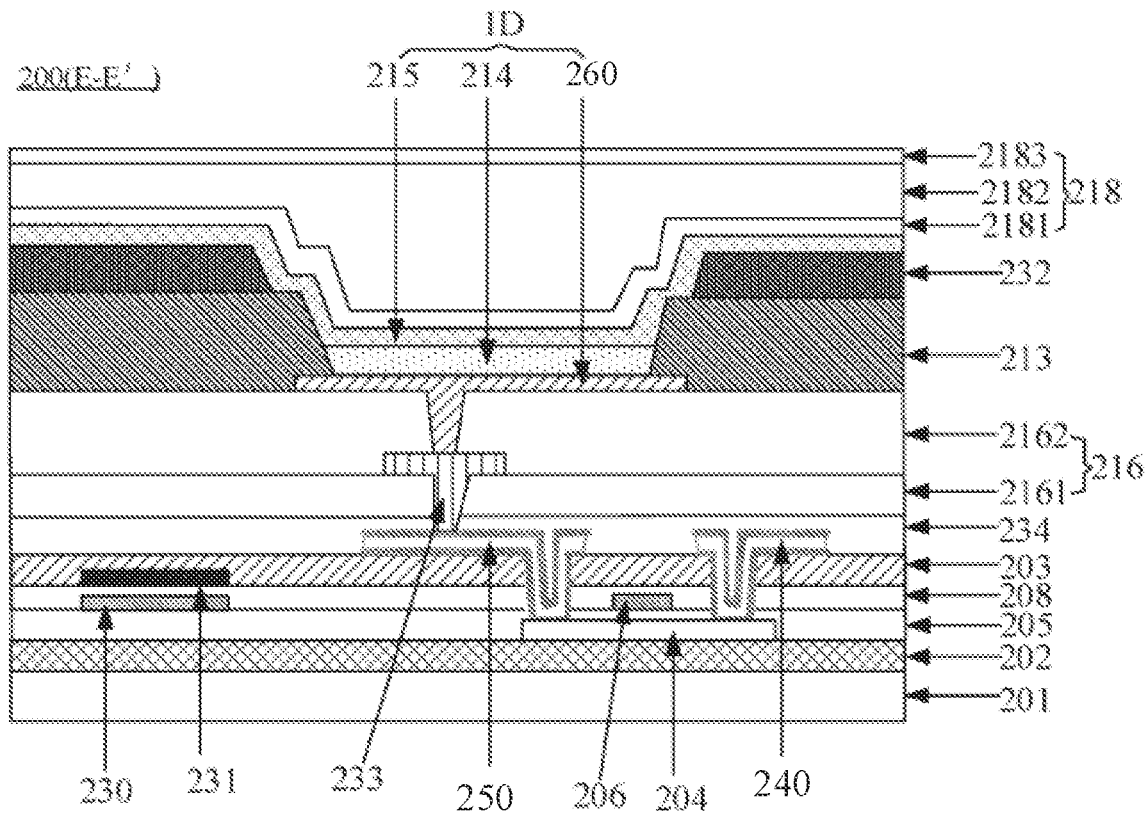
FIG. 23 is a structural diagram of another display substrate, in accordance with some embodiments of the present disclosure.

In some embodiments, as shown in FIG. 23, the first electrode 260 may be electrically connected to the drain 250 through a transfer electrode 233.

In a case where the first electrode 260 is electrically connected to the drain 250 through the transfer electrode 233, the planarization layer 216 may have a double-layer structure, which includes a first planarization film layer (PLN1) 2161 and a second planarization film layer (PLN2) 2162 formed in sequence.

A passivation layer (PVX) 234 may be formed between the first planarization film layer 2161 and the interlayer dielectric layer 203, and the passivation layer 234 may be made of a material such as silicon oxide, silicon nitride or silicon oxynitride. The passivation layer 234 covers the source 240 and the drain 250.

The transfer electrode 233 is formed between the first planarization film layer 2161 and the second planarization film layer 2162, and is electrically connected to the drain 250 through via holes in the first planarization film layer 2161 and the passivation layer 234 in sequence. The first electrode 260 may be electrically connected to the transfer electrode 233 through a via hole in the second planarization film layer 2162. It will be noted that in a case where the planarization layer 216 has the single layer structure, the passivation layer 234 may be also formed between the planarization layer 216 and the interlayer dielectric layer 203.

In some embodiments, as shown in FIGS. 22 and 23, the display substrate 200 further includes an encapsulation layer 218, and the encapsulation layer 218 may include a first inorganic encapsulation sub-layer 2181, an organic encapsulation sub-layer 2182 and a second inorganic encapsulation sub-layer 2183 that are stacked in sequence. The encapsulation layer 218 is used for encapsulation of the display substrate 200 to prevent water and oxygen from entering and eroding the light-emitting devices.

For example, a material of the first inorganic encapsulation sub-layer 2181 and the second inorganic encapsulation sub-layer 2183 may include silicon nitride or silicon oxide.

The organic encapsulation sub-layer 2182 is used for realizing planarization, so as to facilitate forming the second inorganic encapsulation sub-layer 2183, and a material of the organic encapsulation sub-layer 2182 may include acrylic-based polymer, silicon-based polymer, or the like.

The first inorganic encapsulation sub-layer 2181 and the second inorganic encapsulation sub-layer 2183 may be formed through a chemical vapor deposition process or a physical vapor deposition process. The organic encapsulation sub-layer 2182 may be formed through an ink-jet printing process (IJP), or a spraying process.

Figure 24:
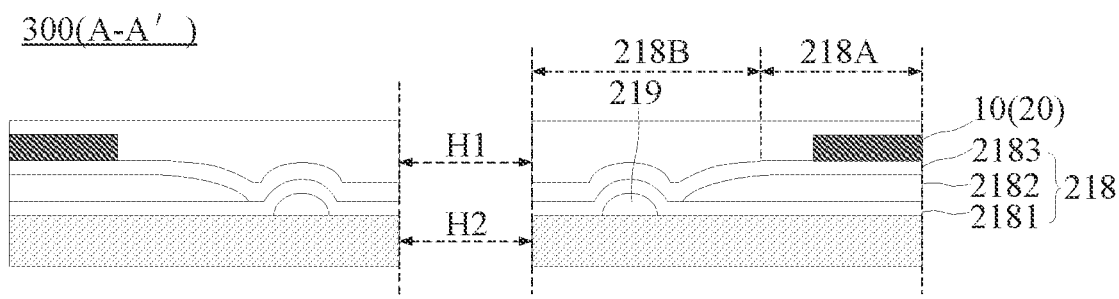
FIG. 24 is a structural diagram of a region of a display substrate located around a functional device mounting hole, in accordance with some embodiments of the present disclosure.

In some embodiments, as shown in FIG. 24, the display substrate 200 further includes at least one circle of barrier wall 219 around the functional device mounting hole H2, and the barrier wall 219 is disposed a surface of the first inorganic encapsulation sub-layer 2181 of the encapsulation layer 218 away from the substrate. In the process of forming the organic encapsulation sub-layer 2182 through the ink-jet printing process, since ink used in the inkjet printing process has fluidity, the barrier wall 219 may block the ink and prevent the ink from leaking from the functional device mounting hole H2.

As shown in FIG. 24, the encapsulation layer 218 covers at least one circle of barrier wall 219. For example, the first inorganic encapsulation sub-layer 2181 and the second inorganic encapsulation sub-layer 2183 of the encapsulation layer 218 cover the at least one circle of barrier wall 219.

As shown in FIG. 24, the encapsulation layer 218 includes a planarization region 218A, and a slope region 218B proximate to the functional device mounting hole H2. The orthogonal projection of the hole edge connecting unit 31 in the touch substrate 100 on the display substrate 200 is within the planarization region 218A of the encapsulation layer 218.

It will be noted that, due to the fluidity of the ink used in the ink-jet printing process, an edge of the organic encapsulation sub-layer 2182 proximate to the functional device mounting hole H2 has a slope, so that the encapsulation layer 218 has the slope region 218B proximate to the functional device mounting hole H2.

The orthogonal projection of the hole edge connecting unit 31 in the touch substrate 100 on the display substrate 200 is within the planarization region 218A of the encapsulation layer 218, so that the hole edge connecting unit 31 is away from the slope region 218B. As a result, in a process of forming the hole edge connecting unit 31 through a photoetching process and an etching process, a problem that the hole edge connecting unit 31 is broken due to large exposure and then an open circuit occurs therein may be avoided.

In some embodiments, the orthogonal projections of the first touch unit 10 and the second touch unit 20 in the touch substrate 100 on the display substrate 200 are both within the planarization region 218A of the encapsulation layer 218.

The orthogonal projections of the first touch unit 10 and the second touch unit 20 in the touch substrate 100 on the display substrate 200 are within the planarization region 218A of the encapsulation layer 218, so that the first touch unit 10 and the second touch unit 20 are away from the slope region 218B. As a result, in a process of forming the first touch unit 10 and the second touch unit 20 through a photoetching process and an etching process, a problem that the first touch unit 10 and the second touch unit 20 are broken due to large exposure and then open circuits occur therein may be avoided.

In the display panel 300 in the above embodiments of the present disclosure, the center of the adjustment connecting unit 32 in the touch substrate 100 is farther from the center D of the mounting hole H1 than the hole edge reference point P, and the shapes of the contours of the touch electrodes electrically connected to the adjustment connecting unit 32 are changed. As a result, the linearity of the scribed line around the mounting hole H1 on the touch substrate 100 may be improved, and the touch precision of the periphery of the mounting hole H1 of the touch substrate 100 may be improved.

In some embodiments, a minimum distance between the center of the orthogonal projection of the adjustment connecting unit 32 on the display substrate 200 and the at least one circle of barrier wall 201 is in a range of 0.8 mm to 1.2 mm, inclusive. For example, the minimum distance is 0.8 mm, 0.9 mm, 1 mm, 1.1 mm or 1.2 mm.

In some embodiments, as shown in FIG. 2A, the display substrate 200 and the touch substrate 100 share the substrate of the display substrate 200. That is, the plurality of first touch units 10 and the plurality of second touch units 20 of the touch substrate 100 are directly disposed on the encapsulation layer 218 of the display substrate 200. The technology of directly forming the touch structure on the encapsulation layer 218 of the display substrate 200 (flexible metal layer on cell, FMLOC) may make the display panel 300 thin and light, and this technology may be applied to an OLED display device that may be folded and rolled.

Figure 2B:
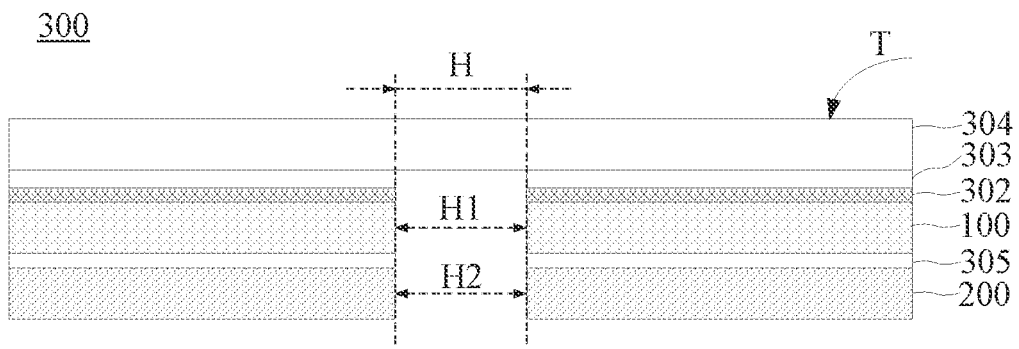
FIG. 2B is a structural diagram of another display panel, in accordance with some embodiments of the present disclosure.

In some embodiments, as shown in FIG. 2B, the touch substrate 100 is attached to the display substrate 200 in an out-cell manner. The touch substrate 100 may be attached to a light exit side of the display substrate 200 through a first adhesive 305.

In some embodiments, after the touch substrate 100 is attached to the display substrate 200, a hole passing through both the touch substrate 100 and the display substrate 200 may be formed. In another embodiment, a hole is formed in each of the touch substrate 100 and the display substrate 200, and then the touch substrate 100 is attached to the display substrate 200, so that the mounting hole H1 of the touch substrate 100 and the functional device mounting hole H2 of the display substrate 200 are communicated with each other as a hole passing through both the touch substrate 100 and the display substrate 200.

As for the touch substrate 100, the touch substrate 100 includes the mounting hole H1 and an active touch region around the mounting hole H1. As for the display substrate 200, the display substrate 200 includes the functional device mounting hole H2 and an active display region around the functional device mounting hole H2. The active touch region and the active display region may be collectively referred to as the active touch display region AA.

In some embodiments, the touch substrate 100 may be integrated in the display substrate 200, and the display panel 300 may be formed in an in-cell manner.

In some embodiments, for the display panel 300, a ratio of its height to its width is in a range of 2 to 2.5, inclusive, for example, the ratio of the height to the width is 2, 2.14, 2.25, 2.4 or 2.5.

In some embodiments, the display panel 300 has four corners, and the corners are each a rounded corner. That is, the display panel 300 has curved edges at the four corners.

In some embodiments, as shown in FIG. 2B, the display panel 300 further includes a polarizer 302 located on a side of the touch substrate 100 away from the display substrate 200, and the polarizer 302 is attached to a surface of the touch substrate 100 away from the display substrate 200. In this way, a reflection effect of the display panel 300 on light in an external environment may be reduced, interference to light emitted by the display panel 300 may be reduced, and influence on the display image of the display panel 300 may be reduced.

In some embodiments, as shown in FIG. 2A, the display panel 300 further includes a cover plate 304. The cover plate 304 is disposed on the side of the touch substrate 100 away from the display substrate 200 to protect internal structures of the display panel 300.

In some embodiments, as shown in FIG. 2B, in a case where the touch substrate 100 is attached to the display substrate 200 in the out-cell manner, the cover plate 304 is attached to a surface of the polarizer 400 away from the touch substrate 100 through a second adhesive 303, so as to protect the internal structures of the display panel 300.

Figure 25:
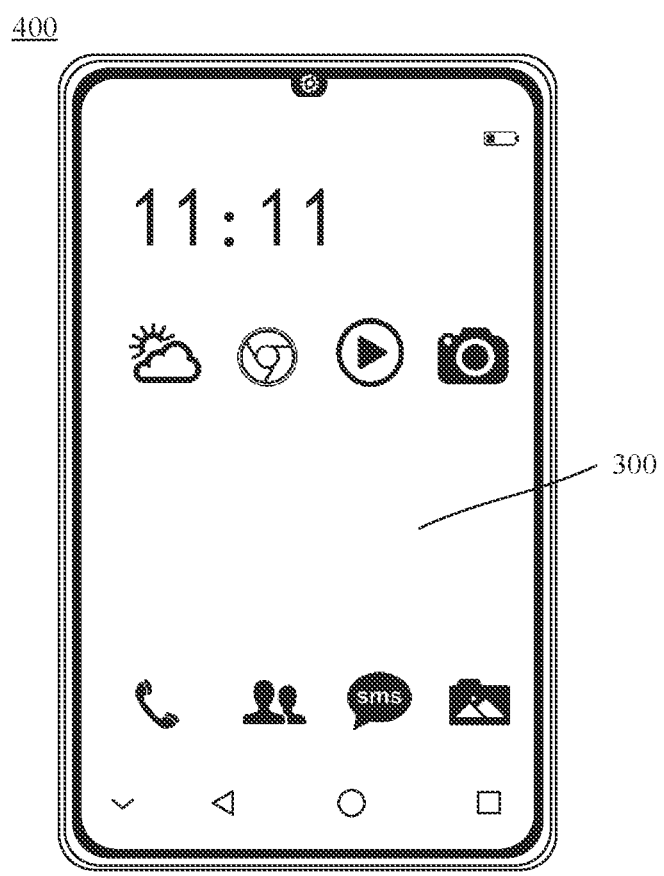
FIG. 25 is a structural diagram of a display device, in accordance with some embodiments of the present disclosure.

Some embodiments of the present disclosure further provide a display device. As shown in FIG. 25, the display device 400 includes the display panel 300 provided by any one of the above embodiments.

In the display device 400 in the above embodiments of the present disclosure, the center of the adjustment connecting unit 32 in the touch substrate 100 is farther from the center O of the mounting hole H1 than the hole edge reference point P, and the contour shapes of the touch electrodes electrically connected to the adjustment connecting unit 32 are changed. As a result, the linearity of the scribed line around the mounting hole H1 on the touch substrate 100 may be improved, and the touch precision of the periphery of the mounting hole H1 of the touch substrate 100 may be improved.

The display device 400 may be an electroluminescent display device, and the electroluminescent display device may be an organic electroluminescent (organic light-emitting diode (OLED)) display device or a quantum dot electroluminescent (quantum dot light-emitting diode (QLED)) display device.

The display device 400 may be any device that displays images whether in motion (e.g., a video) or stationary (e.g., a static image), and whether literal or graphical. More particularly, it is contemplated that the embodiments may be implemented in or associated with a variety of electronic devices. The variety of electronic devices are, for example (but not limited to), mobile phones, wireless apparatuses, personal data assistants (PDAs), hand-held or portable computers, global positioning system (GPS) receivers/navigators, cameras, MP4 video players, camcorders, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packagings, and aesthetic structures (e.g., a display for displaying an image of a piece of jewelry).

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A touch substrate providing with a mounting hole, the touch substrate having a hole edge region around the mounting hole, and a main touch region located outside of the hole edge region, and the touch substrate comprising:
   a substrate;
   a plurality of first touch units disposed on the substrate each extending in a first direction and including a plurality of first touch electrodes and a plurality of first connecting portions, and each first connecting portion being electrically connected to two adjacent first touch electrodes; and
   a plurality of second touch units disposed on the substrate and insulated from the plurality of first touch units, each second touch unit extending in a second direction and including a plurality of second touch electrodes and a plurality of second connecting portions, and each second connecting portion being electrically connected to two adjacent second touch electrodes; and
   the first direction intersecting with the second direction,
      wherein an orthogonal projection of each first connecting portion on the substrate at least partially overlaps with an orthogonal projection of a second connecting portion on the substrate, and the first connecting portion and the corresponding second connecting portion form a connecting unit;
      a plurality of connecting units located in the hole edge region are hole edge connecting units, and at least one of the plurality of hole edge connecting units is an adjustment connecting unit;
      in a first touch unit corresponding to the adjustment connecting unit, a straight line where a line connecting centers of at least two first touch electrodes located in the main touch region is located is a first reference line;
      in a second touch unit corresponding to the adjustment connecting unit, a straight line where a line connecting centers of at least two second touch electrodes located in the main touch region is located is a second reference line; and
      an intersection point of the first reference line and the second reference line is a hole edge reference point; and
      in a direction parallel to a plane of the substrate on which the plurality of first touch units and the plurality of second touch units are disposed, at least a part of the adjustment connecting unit is further from an edge of the mounting hole than the hole edge reference point.

2. The touch substrate according to claim 1, wherein the hole edge connecting units include a first hole edge connecting unit, a second hole edge connecting unit, a third hole edge connecting unit and a fourth hole edge connecting unit that are disposed around the mounting hole,
   wherein in the first direction, the first hole edge connecting unit and the third hole edge connecting unit are adjacent to each other and are electrically connected to a same first touch electrode, and the second hole edge connecting unit and the fourth hole edge connecting unit are adjacent to each other and are electrically connected to another same first touch electrode; and
   in the second direction, the first hole edge connecting unit and the second hole edge connecting unit are adjacent to each other and are electrically connected to a same second touch electrode, and the third hole edge connecting unit and the four hole edge connecting unit are adjacent to each other and are electrically connected to another same second touch electrode.

3. The touch substrate according to claim 2, wherein a hole edge reference point corresponding to the first hole edge connecting unit is a first hole edge reference point, and a hole edge reference point corresponding to the second hole edge connecting unit is a second hole edge reference point, a hole edge reference point corresponding to the third hole edge connecting unit is a third hole edge reference point, and a hole edge reference point corresponding to the fourth hole edge connecting unit is a fourth hole edge reference point; and in the direction parallel to the plane of the substrate, of the first hole edge connecting unit, the second hole edge connecting unit, the third hole edge connecting unit and the fourth hole edge connecting unit, at least one hole edge connecting unit is the adjustment connecting unit, and a distance between a center of the adjustment connecting unit and a center of the mounting hole is greater than a distance between a hole edge reference point corresponding to the adjustment connecting unit and the center of the mounting hole;

in a case where of the first hole edge connecting unit, the second hole edge connecting unit, the third hole edge connecting unit and the fourth hole edge connecting unit, the at least one hole edge connecting unit includes one adjustment connecting unit, two adjustment connecting units or three adjustment connecting units, of the first hole edge connecting unit, the second hole edge connecting unit, the third hole edge connecting unit and the fourth hole edge connecting unit, a center of each hole edge connecting unit of three hole edge connecting units, two hole edge connecting units or one hole edge connecting unit other than the one adjustment connecting unit, the two adjustment connecting units or the three adjustment connecting units overlaps with a corresponding hole edge reference point.

4. The touch substrate according to claim 3, wherein in the direction parallel to the plane of the substrate, of the first hole edge connecting unit, the second hole edge connecting unit, the third hole edge connecting unit and the fourth hole edge connecting unit, distances between centers of at least two hole edge connecting units and the center of the mounting hole are different.

5. The touch substrate according to claim 2, wherein the first hole edge connecting unit and the third hole edge connecting unit are adjustment connecting units, and a center of the first hole edge connecting unit and a center of the third hole edge connecting unit are symmetrical with respect to a straight line passing through a center of the mounting hole in the second direction; or the second hole edge connecting unit and the fourth hole edge connecting unit are adjustment connecting units, and a center of the second hole edge connecting unit and a center of the fourth hole edge connecting unit are symmetrical with respect to the straight line passing through the center of the mounting hole in the second direction; or the first hole edge connecting unit, the second hole edge connecting unit, the third hole edge connecting unit and the fourth hole edge connecting unit are adjustment connecting units;

the center of the first hole edge connecting unit and the center of the third hole edge connecting unit are symmetrical with respect to the straight line passing through the center of the mounting hole in the second direction; and the center of the second hole edge connecting unit and the center of the fourth hole edge connecting unit are symmetrical with respect to the straight line passing through the center of the mounting hole in the second direction.

6. The touch substrate according to claim 1, wherein in the direction parallel to the plane of the substrate, a center of the adjustment connecting unit is on the first reference line or the second first reference line.

7. The touch substrate according to claim 1, wherein each first touch electrode includes two first sub-electrodes electrically connected to each other, and each second touch electrode includes two second sub-electrodes electrically connected to each other;

the plurality of first touch units and the plurality of second touch units are divided into a plurality of capacitor units, and each capacitor unit includes a single connecting unit, and two adjacent first sub-electrodes that are electrically connected to the connecting unit and two adjacent second sub-electrodes that are electrically connected to the connecting unit; and a difference between mutual capacitance values of a capacitor unit, before touch occurs in a region of the capacitor unit and after the touch occurs in the region thereof, where the adjustment connecting unit is located is C1, and a difference between mutual capacitance values of a capacitive unit, before touch occurs in a region of the capacitor unit and after the touch occurs in the region thereof, located in the main touch region is C2; and a ratio of C1 to C2 is in a range of 0.55 to 0.58, inclusive.

8. The touch substrate according to claim 7, wherein the at least one of the plurality of hole edge connecting units includes a plurality of adjustment connecting units, shapes of two adjacent first sub-electrodes electrically connected to a same adjustment connecting unit are different from a shape of a first sub-electrode located in the main touch region; and shapes of two adjacent second sub-electrodes electrically connected to another same adjustment connecting unit are different from a shape of a second sub-electrode located in the main touch region; or the at least one of the plurality of hole edge connecting units includes the plurality of adjustment connecting units, of two adjacent first sub-electrodes and two adjacent second sub-electrodes that are electrically connected to a same adjustment connecting unit, shapes of contours, proximate to each other, of a first sub-electrode and a second sub-electrode are complementary to each other; or the at least one of the plurality of hole edge connecting units includes the plurality of adjustment connecting units;

the shapes of the two adjacent first sub-electrodes electrically connected to the same adjustment connecting unit are different from the shape of the first sub-electrode located in the main touch region;

the shapes of the two adjacent second sub-electrodes electrically connected to the another same adjustment connecting unit are different from the shape of the second sub-electrode located in the main touch region;

of the two adjacent first sub-electrodes and the two adjacent second sub-electrodes that are electrically connected to the same adjustment connecting unit, the shapes of the contours, proximate to each other, of the first sub-electrode and the second sub-electrode are complementary to each other.

9. The touch substrate according to claim 1, further comprising:
an insulating layer disposed on the substrate, the insulating layer being provided with a plurality of via holes therein,
wherein a layer where the plurality of first touch electrodes, the plurality of second touch electrodes and the plurality of first connecting portions are disposed is an electrode layer, and a layer where the plurality of second connecting portions are disposed is a bridge layer;
the electrode layer is closer to or farther from the substrate than the bridge layer, the insulating layer is located between the electrode layer and the bridge layer;
in the first direction, every two adjacent first touch electrodes are directly electrically connected through a first connecting portion therebetween;
in the second direction, the second connecting portion is electrically connected to the two adjacent second touch electrodes through different via holes; or
a layer where the plurality of first touch electrodes, the plurality of second touch electrodes and the plurality of second connecting portions are disposed is the electrode layer, and a layer where the plurality of first connecting portions are disposed is the bridge layer;
the electrode layer is closer to or farther from the substrate than the bridge layer, the insulating layer is located between the electrode layer and the bridge layer;
in the second direction, every two adjacent second touch electrodes are electrically connected through a second connecting portion therebetween;
in the first direction, the first connecting portion is electrically connected to the two adjacent first touch electrodes through different via holes.

10. The touch substrate according to claim 9, wherein the plurality of first connecting portions are disposed in the bridge layer, the first connecting portion includes at least one first bridge electrode, and the at least one first bridge electrode is electrically connected to the two adjacent first touch electrodes; or
the plurality of second connecting portions are disposed in the bridge layer, and the second connecting portion includes at least one second bridge electrode, and the at least one second bridge electrode is electrically connected to the two adjacent second touch electrodes.

11. The touch substrate according to claim 10, wherein the plurality of first connecting portions are disposed in the bridge layer, the first connecting portion includes a plurality of first bridge electrodes arranged side by side in the second direction, and each first bridge electrode is electrically connected to the two adjacent first touch electrodes, and extends in the first direction; or
the plurality of second connecting portions are disposed in the bridge layer, and the second connecting portion includes a plurality of second bridge electrodes arranged side by side in the first direction, and each second bridge electrode is electrically connected to the two adjacent first touch electrodes, and extends in the second direction.

12. The touch substrate according to claim 1, wherein the first connecting portion, the second connecting portion, each first touch electrode and each second touch electrode each have a metal mesh structure.

13. The touch substrate according to claim 1, wherein in a first touch unit and a second touch unit passing through the mounting hole, each touch electrode around the mounting hole is a hole edge electrode; and
the touch substrate further comprises:
a connecting ring disposed around the mounting hole, the connecting ring including at least two connecting segments arranged at intervals, and each connecting segment being electrically connected to a hole edge electrode.

14. The touch substrate according to claim 13, wherein the touch substrate comprises a first hole edge electrode and a second hole edge electrode, the connecting ring includes a first connecting segment and a second connecting segment;
the first connecting segment is electrically connected to the first hole edge electrode, and the second connecting segment is electrically connected to the second hole edge electrode;
an area of the first hole edge electrode is less than an area of the second hole edge electrode, and a length of the first connecting segment is greater than a length of the second connecting segment.

15. The touch substrate according to claim 13, wherein the touch substrate further has a wiring region around the mounting hole, and the wiring region is located between the mounting hole and the hole edge region; and
the touch substrate further comprises:
a light blocking ring disposed in the wiring region, the light blocking ring having at least one opening therein, and the light blocking ring being unconnected at the at least one opening.

16. The touch substrate according to claim 15, wherein the light blocking ring at least includes a first light blocking layer and a second light blocking layer that are stacked on the substrate in sequence,
wherein the first light blocking layer is made of a same material and disposed in a same layer as the first touch electrodes and the second touch electrodes; and
the second light blocking layer is made of a same material and disposed in another same layer as the connecting ring.

17. The touch substrate according to claim 1, wherein a dimension of the touch substrate in the first direction is greater than a dimension of the touch substrate in the second direction, a first touch electrode is provided therein with an opening; or
a dimension of the touch substrate in the second direction is greater than a dimension of the touch substrate in the first direction, a second touch electrode is provided therein with another opening.

18. The touch substrate according to claim 17, wherein a shape of a dummy electrode located in the hole edge region is different from a shape of a dummy electrode located in the main touch region.

19. A display panel, comprising:
a display substrate; and
the touch substrate according to claim 1, the touch substrate being disposed on a light exit side of the display substrate.

20. A display device, comprising the display panel according to claim 19.

* * * * *